United States Patent [19]

Aihara et al.

[11] Patent Number: 5,453,627
[45] Date of Patent: Sep. 26, 1995

[54] QUANTUM INTERFERENCE DEVICE AND COMPLEMENTARY LOGIC CIRCUIT UTILIZING THEREOF

[75] Inventors: Kimihisa Aihara, Isehara; Masafumi Yamamoto; Takashi Mizutani, both of Atsugi, all of Japan

[73] Assignee: Nippon Telegraph and Telephone Corporation, Tokyo, Japan

[21] Appl. No.: 59,591

[22] Filed: May 12, 1993

[30] Foreign Application Priority Data

| May 14, 1992 | [JP] | Japan | 4-146800 |
| Nov. 24, 1992 | [JP] | Japan | 4-334910 |
| Nov. 26, 1992 | [JP] | Japan | 4-339603 |
| Dec. 1, 1992 | [JP] | Japan | 4-343595 |

[51] Int. Cl.$^6$ .................................................. H01L 29/161
[52] U.S. Cl. ......................... 257/24; 257/194; 257/195
[58] Field of Search ............................ 257/194, 27, 24, 257/195, 287, 14, 183, 268, 280

[56] References Cited

U.S. PATENT DOCUMENTS

| 4,733,283 | 3/1988 | Kuroda | 257/195 |
| 4,942,437 | 7/1990 | Fowler et al. | 257/194 |
| 5,003,360 | 3/1991 | Okada et al. | 257/14 |
| 5,157,467 | 10/1992 | Fujii | 257/27 |
| 5,233,205 | 8/1993 | Usagawa et al. | 257/194 |
| 5,270,557 | 12/1993 | Schmidt | 257/194 |
| 5,285,081 | 2/1994 | Ando | 257/194 |
| 5,332,911 | 7/1994 | von Klitzing et al. | 257/194 |

FOREIGN PATENT DOCUMENTS

| 0394590 | 10/1990 | European Pat. Off. | 257/194 |
| 59-98559 | 6/1984 | Japan | 257/194 |
| 3-71675 | 3/1991 | Japan | 257/27 |

OTHER PUBLICATIONS

D. C. Miller et al, "Modulation of the Conductance of T–shaped Electron Waveguide Structures with a Remote Gate" *Nanostructure Physics and Fabrication*, 1989, pp. 165–174.

S. Bandyopadhyay et al, "A Novel Quantum Interference Transistor (QUIT) with Extremely Low Power–Delay Product and Very High Transconductance", *Proceeding of IEDM*, vol. 76, 1986, pp. 76–79.

Fernando Sols et al, "Theory for a Quantum Modulated Transistor", *J. of Applied Physics*, vol. 66, (8), 15 Oct. 1989, pp. 3892–3906.

Toshihiro Itoh et al, "Transport Properties of Ballistic Quantum Wire", *Extended Abstract 1992 of International Conference on Solid State Devices and Materials*, Tsukuba, 1992, pp. 753–755.

(List continued on next page.)

*Primary Examiner*—Sara W. Crane
*Assistant Examiner*—Courtney A. Bowers
*Attorney, Agent, or Firm*—Spencer, Frank & Schneider; Christopher H. Lynt

[57] ABSTRACT

A quantum interference device has semiconductor heterojunctions laminated on a semiconductor substrate for forming a two-dimensional electron gas channel. On the semiconductor heterojunctions are formed a first, a second and a third electrode which, upon the application of a negative voltage, form a depletion region within the semiconductor heterojunctions, thereby making the resulting two-dimensional electron gas channel a quantum wire of a stub structure comprising an entrance and an exit for electron waves, and a stub formed between the entrance and the exit. The second and third electrodes each have a first side substantially parallel to a side of the first electrode. The second and third electrodes also have a second side parallel to each other's second side. On a site near the edge of said stub is provided a fourth electrode for defining the effective length of the stub by a voltage applied thereto.

12 Claims, 17 Drawing Sheets

OTHER PUBLICATIONS

Kimihisa Aihara et al, "Three–terminal operation of a Quantum Interference Device Using . . . ", *IEDM,* 1992, pp. 491–494.

Kimihisa Aihara et al, "Conductance Oscillations in a Quantum Wire with a Stub Structure due to Quantum Interference", *Jpn. J. Appl. Phys.,* vol. 31, 1992 (Jul.), pp. L916–L919.

FIG.8A
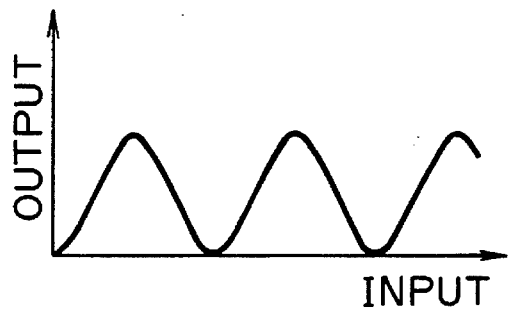
FIG.8C
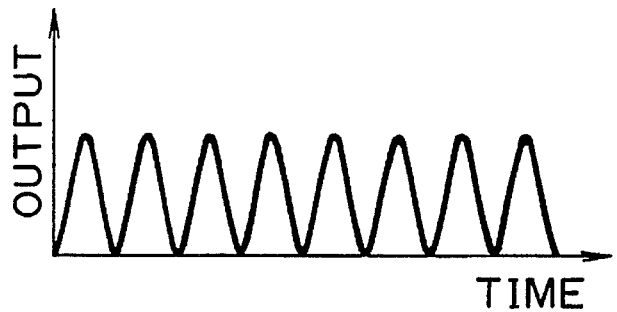
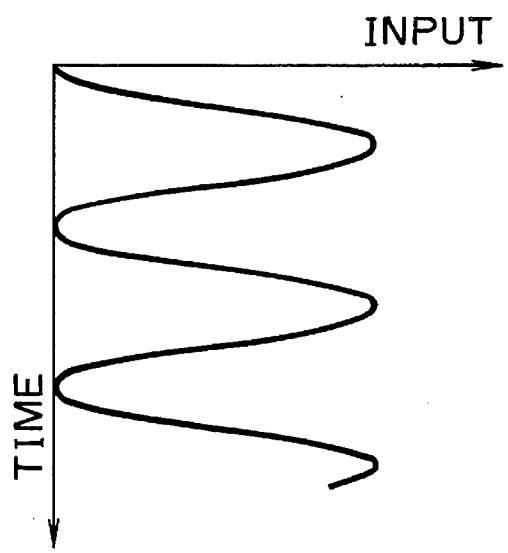
FIG.8B

QUANTUM INTERFERENCE DEVICE AND COMPLEMENTARY LOGIC CIRCUIT UTILIZING THEREOF

BACKGROUND OF THE INVENTION

1. Field of the Invention

The present invention relates to a quantum interference device utilizing the interference of electron waves, and to a complementary logic circuit constructed by connecting together a plurality of quantum interference devices.

2. Description of the Prior Art

An electron has the nature of a particle and that of a wave. Ordinary semiconductor devices such as diodes, transistors, and integrated circuits comprising them combined together, utilize the nature of an electron as a particle. Recent progresses in crystal growth technologies and microfabrication techniques, on the other hand, have enabled the production of devices utilizing the nature of an electron as a wave. Quantum interference devices that modulate the conductance of the device by controlling the interference of electron waves are being studied as such devices. High expectation is placed on the realization of quantum interference devices as elements with a high mutual conductance and capable of high frequency operation, including ultra-high speed switching, or as analog elements for frequency multiplication.

Quantum interference devices are available as devices having a stub structure or a ring structure. Miller et al. have reported that the conductance of such a device can be modulated by forming a gate electrode on a stub of a T-shaped electron waveguide structure or a quantum wire structure with the stub, and controlling a voltage applied to the gate electrode (D. C. Miller, R. K. Lake, S. Datta, M. S. Lundstrom, M. R. M elloch, and R. Reifenberger; "Modulation of the conductance of T-shaped electron waveguide structures with a remote gate electrode," Nanostructure Physics and Fabrication, Academic Press, Inc. (1989), pp. 165–174).

FIG. 1A is a schematic plan view of the quantum interference device of Miller et al., while FIGS. 1B and 1C are schematic Sectional views taken along the lines B—B and C—C, respectively, of FIG. 1A. As illustrated in FIGS. 1A and 1B, a quantum wire 11 has a T-shaped structure or a stub structure in which semiconductor heterojunctions comprising an undoped-GaAs (ud-GaAs) layer 11a, an undoped-AlGaAs (ud-AlGaAs) layer 11b, an n-AlGaAs layer 11c, and an $n^+$-GaAs layer 11d formed on a ud-GaAs substrate 11S are finely processed by etching to a width of 0.30–0.4 μm, and a stub 14 is formed behind a branched portion 16. A gate electrode 15 is disposed above a part of the stub 14. An electron wave ① entered from an entrance 12 is transmitted through a channel 17 to the branched portion 16, where it is divided into an electron wave ② going into the stub 14, and an electron wave ④ traveling toward an exit 13. The electron wave ② is reflected aE the rear end of the stub 14, and returned to the branched portion 16 as an electron wave ③. There, the electron wave ③ and the electron wave ① interfere with each other. If the phase of the electron wave ③ and that of the electron wave ① are in phase, the probability of transmission from the entrance 12 to the exit 13 is high. If their phases are opposite to each other, the transmission probability is low. The phase relationship at the time of interference is determined by a stub length, Ls. The stub length Ls is controlled by voltage that is applied to the gate electrode 15 formed above the quantum wire 11. That is, this device performs a 3-terminal operation by imparting a potential difference between the exit 13 and the entrance 12, and applying a control voltage to the gate electrode 15.

In the above quantum interference element of an electric field control type, the transverse mode number contributing to transmission is desirably small in order to obtain satisfactory switching characteristics based on an interference effect. Ideally, a single mode operation which gives a transverse mode number of 1 is desirable.

In the above-described conventional device, however, the quantum wire 11 is formed by etching and have a mesa type structure thus inevitably involving the reflection and interference of electron waves due to tiny irregularities of its side walls, and making it difficult to control the mode number of the channel 17 by controlling the channel width. Hence, a single mode channel with marked interference characteristics is difficult to achieve with this type of device. With the conventional quantum interference device, moreover, the electron concentration (electron wavelength) of the channel cannot be controlled freely, and so the modulation period of conductance cannot be controlled.

S. Bandyopadhyay et al. have proposed a quantum interference transistor (QUIT) which controls conductance by introducing a potential difference between two channels which in turn gives rise to a phase shift between electrons by a control terminal (Proceeding of IEDM, 1986, pp. 76–79). The QUIT of Bandyopadhyay et al. is a quantum interference transistor using a longitudinal ring structure formed by laminating two channels connected together at both ends within a semiconductor substrate. This type of quantum interference transistor has a region with a positive transconductance and a region with a negative transconductance relative to a gate voltage, since conductance generally oscillates as a function of the gate voltage. In the foregoing conventional device, two quantum interference devices of a longitudinal ring structure are connected in series, with one of them being biased in the positive transconductance region and the other being biased in the negative transconductance region. This permits the construction of a complementary logic circuit in which the channel of one of the devices is turned off in a static condition. A quantum interference transistor works at a power source voltage of the order of at most several tens of millivolts, and the realization of a complementary logic circuit enables operation with an ultra-low power consumption.

F. Sols et al. have proposed the construction of a complementary inverter circuit by connecting in series two interference transistors with slightly varied stub lengths which have a quantum wire of a stub-shaped protruding structure and a gate electrode for varying the stub length (F. Sols, M. Macucci, U. Ravaioli, K. Hess; J. Appl. Physics, vol. 66 (1989), pp. 3892–3906).

However, the longitudinal quantum interference ring of Bandyopadhyay et al. was very difficult to produce, because its manufacture required epitaxial growth, followed by the formation of a barrier for separating the upper and lower paths by etching, further followed by regrowth by the epitaxial technique; also, the device had to be produced vertically symmetrically for its operation. Furthermore, the gate voltage had to be biased for device construction, making the device structure and circuit construction complicated.

Sols et al., on the other hand, only made a theoretical investigation, and their paper only described the use of two interference transistors with slightly varied stub lengths in regard to the way of achieving interference transistors complementary to each other. It presented no concrete way of achieving them.

SUMMARY OF THE INVENTION

This invention was accomplished in an attempt to eliminate the above drawbacks of the conventional devices.

An object of the present invention is to achieve an element structure in which the length of a protruding quantum wire structure (stub) can be controlled, and the mode number of electron waves transmitted through a channel can be controlled by controlling the channel width of the quantum wire and the stub, thereby obtaining sufficient conductance modulating characteristics by a third electrode, thus realizing a satisfactory 3-terminal element.

Another object of the present invention is to provide a quantum interference device capable of separately controlling the formation of a channel by a voltage applied on the split gate electrodes and controlling the conductance of the device by a voltage applied on a stub gate electrode.

A further object of the present invention is to provide a quantum interference device capable of varying the modulation period of conductance.

A still further object of the invention is to achieve a complementary logic circuit by using a quantum interference transistor of a simple structure as a basic element, and connecting together two kinds of such interference transistors which perform complementary actions.

In the first aspect of the present invention, there is provided a quantum interference device comprising:

semiconductor heterojunctions laminated on a semiconductor substrate for forming a two-dimensional electron gas channel;

a first, a second and a third electrode formed on the semiconductor heterojunctions and for forming a depletion region within the semiconductor heterojunctions by applying a negative voltage thereon thereby making the resulting two-dimensional electron gas channel a quantum wire of a stub structure comprising an entrance and an exit for electron waves and a stub formed between the entrance and the exit, the second electrode and the third electrode each having a first side substantially parallel to a side of the first electrode, and the second electrode and the third electrode each having a second side parallel to each other's second side; and a fourth electrode provided on a site near the edge of the stub for defining the effective length of the stub by a voltage applied thereto.

Here, the conductance of the device may be modulated by controlling the voltage applied to the fourth electrode.

The fourth electrode may be provided on the semiconductor heterojunctions and an insulating film formed on the second and third electrodes and may be connected to the semiconductor heterojunctions via a through-hole of the insulating film.

A quantum interference device may further comprise a fifth electrode for controlling the electron concentration in the quantum wire.

The fifth electrode may be a Schottky electrode provided on an insulating film having a through-hole of nearly the same shape as that of the stub-structure quantum wire, the insulating film being formed on the semiconductor heterojunction, and may be connected to the semiconductor heterojunctions via the through-hole.

The fifth electrode may be provided on the back of the semiconductor substrate.

The conductance modulation period of the device may be varied by a voltage applied to the fifth electrode.

In a second aspect of the present invention, there is provided a complementary logic circuit comprising:

a normally-on quantum interference device having an entrance and an exit for electron waves and a first control electrode, wherein when a control signal to be inputted into the first control electrode takes a binary value of "0", the conductance takes a binary value of "1", while when the control signal to be inputted into the first control electrode represents "1", the conductance takes "0"; and a normally-off quantum interference device having an entrance and an exit for electron waves and a second control electrode, wherein when a control signal to be inputted into the second control electrode takes a binary value of "0", the conductance takes a binary value of "0", while when the control signal to be inputted into the second control electrode represents "1", the conductance takes "1"; wherein either the entrance of the normally-on quantum interference device and the exit of the normally-off quantum interference device, or the exit of the normally-on quantum interference device and the entrance of the normally-off quantum interference device are connected in series via means for destroying phase coherence between both quantum interference devices.

Here, each of the normally-on and normally-off quantum interference devices may include a quantum wire having a stub-like protrusion, and the first and second control electrodes may be provided near an edge of the respective stub-like protrusions;

when the control signal given to the first electrode represents a binary value of "0", the effective length L of the stub-like protrusion of the normally-on quantum interference device has the following relationship with the electron wavelength λ

$$L=(\lambda/4)(2m+1)$$

where m denotes 0 or an integer;

when the control signal given to the second electrode represents a binary value of "0", the effective length L of the stub-like protrusion of the normally-off quantum interference device has the following relationship with the electron wavelength λ

$$L=(\lambda/4)(2n)$$

where n denotes an integer; and the value "1" of the control signal is set at such a value when the control signal given to the first and second control electrodes is changed from the binary value "0" to "1", the effective stub length of the normally-on quantum interference device and the normally-off quantum interference device, respectively, varies by λ/4, whereby the normally-on quantum interference device and the normally-off quantum interference device perform operations complementary to each other.

The normally-on quantum interference device and the normally-off quantum interference device each may comprise:

semiconductor heterojunctions laminated on a semiconductor substrate to form a two-dimensional electron gas channel;

a first, a second and a third electrode formed on the semiconductor heterojunctions and for forming a depletion region within the semiconductor heterojunctions by applying a negative voltage thereon thereby making the resulting two-dimensional electron gas channel a quantum wire of a stub structure comprising the entrance and the exit for electron waves and a stub formed between the entrance and the exit, the second electrode and the third electrode each having a respective first side substantially parallel to a side of the first electrode, and the respective second electrode and the third electrode each having a second side parallel to each other; and the first electrode is provided on a site near an edge of the stub of the normally-on quantum interference device and the second control electrode is provided on a site near an edge of the stub of the normally-off quantum interference device.

The normally-on quantum interference device may have a ring structure including a first branch and a second branch connected in parallel, each branch consisting of a quantum wire, the first control electrode comprising a Schottky electrode and being provided on the first branch, the first control electrode being given the control signal such that when the control signal represents a binary value of "0" or "1"; the conductance takes a binary value of "1" or "0"; and The normally-off quantum interference device may have a ring structure including a third branch and a fourth branch connected in parallel, each branch consisting of a quantum wire, the second control electrode comprising a Schottky electrode and being provided on the third branch, the second control electrode being given the control signal which takes a binary value of "0" or "1", and the fourth branch being provided with a gate electrode giving a fixed bias control signal which always takes a binary value of "1" so that the conductance takes a binary value of "0" or "1" in response to the "0" or "1" state of the control signal.

The above and other objects, effects, features and advantages of the present invention will become more apparent from the following description of embodiments thereof taken in conjunction with the accompanying drawings.

BRIEF DESCRIPTION OF THE DRAWINGS

FIGS. 8A–8C are diagrams for explaining the characteristics of the quantum interference device according to the invention used as a frequency multiplier, in which FIG. 8A shows an input-output characteristic curve of the device, FIG. 8B shows a wave form of an input signal, and FIG. 8C shows a wave form of an output;

DETAILED DESCRIPTION OF PREFERRED EMBODIMENTS

Figure 2A:
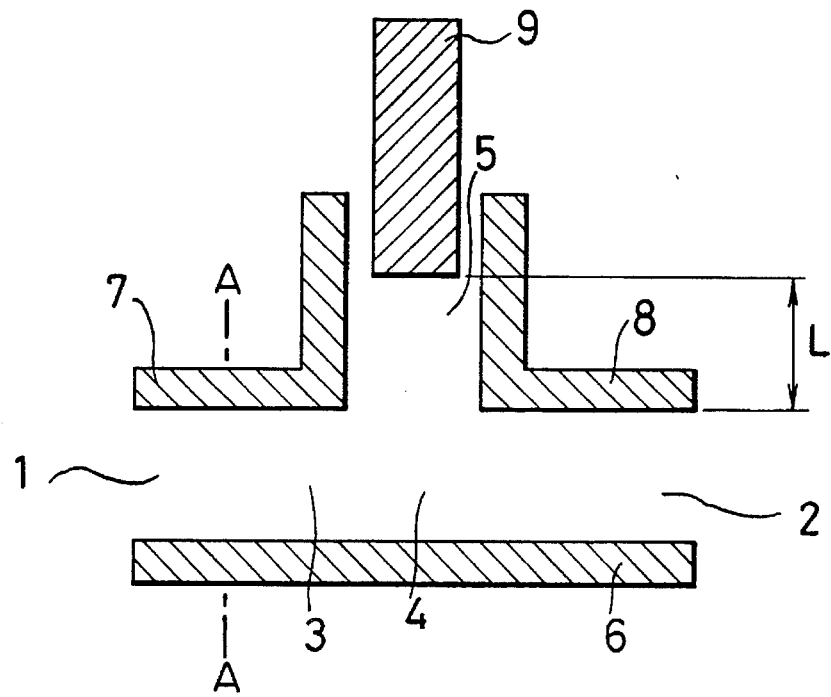
FIG. 2A is a schematic plan view of the essential part of a first embodiment of the quantum interference device in accordance with the present invention.
Figure 2B:
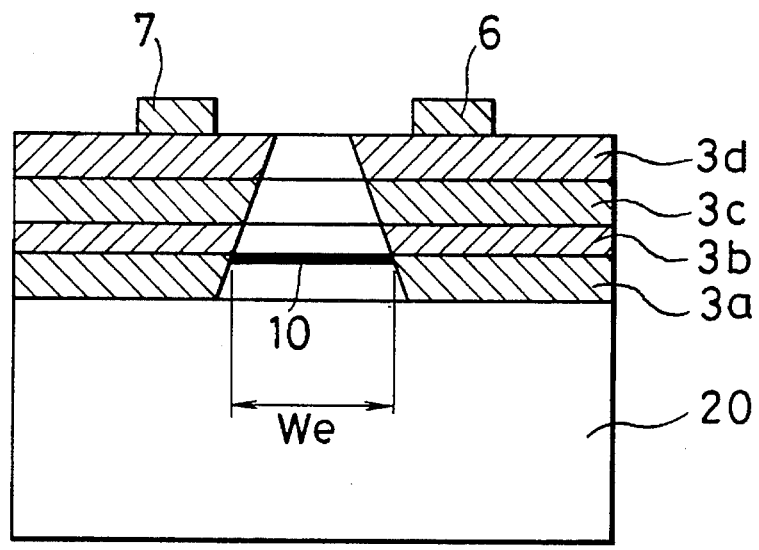
FIG. 2B is a sectional view taken along the line A—A of FIG. 2A.

The first embodiment of the present invention will be described with reference to FIGS. 2A and 2B. FIG. 2A is a schematic plan view of the essential part of the quantum interference device in accordance with the present invention, while FIG. 2B is a sectional view taken along the line A—A of FIG. 2A. A quantum wire 3 has an entrance 1 for an electron wave, an exit 2 for an electron wave, a branched portion 4, and a stub 5 of the protruding wire structure. A first split gate electrode 6, a second split gate electrode 7, and a third split gate electrode 8 are provided to form the quantum wire 3. In this embodiment, the first split gate electrode 6 is linear, while the second and third split gate electrodes 7 and 8 are L-shaped, respectively, with a side 7A and a side 8A parallel to a side of the first split gate electrode 6, and a side 7B and a side 8B parallel to each other. The second and third split gate electrodes 7 and 8 may be rectangular rather than L-shaped. The branch of the quantum wire 3 need not have an angle of 90 degrees; in the three portions of the branched quantum wire, it suffices for any two facing split gate electrodes to be substantially parallel to each other. Furthermore, the first split gate electrode 6 may be non-linear and the branch of the quantum wire may have a Y-shape. A stub gate electrode 9 is provided between the second split gate electrode 7 and the third split gate electrode 8 to control the effective length of the stub 5. Here, the entrance 1 and the exit 2 each refer to an interface where a channel broadened two-dimensionally changes into a wire-like one-dimensional channel. Voltage can be applied to the gate electrodes 6, 7, 8 and 9 separately from each other.

The structure illustrated in FIG. 2A is prepared by the following steps: As shown in FIG. 2B, a semiconductor heterostructure comprising a ud(undoped)-GaAs layer 3a (thickness, e.g. 6,000 Å), a ud-AlGaAs layer 3b (thickness, e.g. 100 Å), an n-AlGaAs layer 3c (thickness, e.g. 500 Å), and an $n^+$-GaAs layer 3d (thickness, e.g. 100 Å) is formed on a semi-insulating GaAs substrate 20 by the MBE method. Then, the first, second and third split gate electrodes 6, 7 and 8 as well as stub gate electrode 9, each composed of an TiAu alloy, are formed on the heterostructure by evaporation. The ud-AlGaAs layer 3b is a buffer layer, the n-AlGaAs layer 3c is an electron donor layer, and the $n^+$-GaAs layer 3d is a cap layer. In FIG. 2A, the distance between the first split gate electrode 6 and the second and third split gate electrodes 7, 8 is 0.6 µm, the length from the entrance 1 to the exit 2 is 1.2 µm, and the length L of the stub 5 is 0.2 µm. The dimensions described here are merely those of a test-produced example element, and are not necessarily mandatory.

Because of the above construction, a two-dimensional electron gas channel is formed in the ud-GaAs layer 3a and in the vicinity of the interface between the ud-AlGaAs layer 3b and the ud-GaAs layer 3a. When a negative voltage is applied to the first, second and third split gate electrodes 6, 7 and 8, the hatched portions of the respective layers 3a to 3d making up the heterostructure are converted into depletion regions, and a channel 10 is formed in a non-depleted tiny region sandwiched between the depletion regions. "We" represents an effective channel width. The thickness and width of the channel 10 meet the conditions for the quantum wire.

Figure 1A:
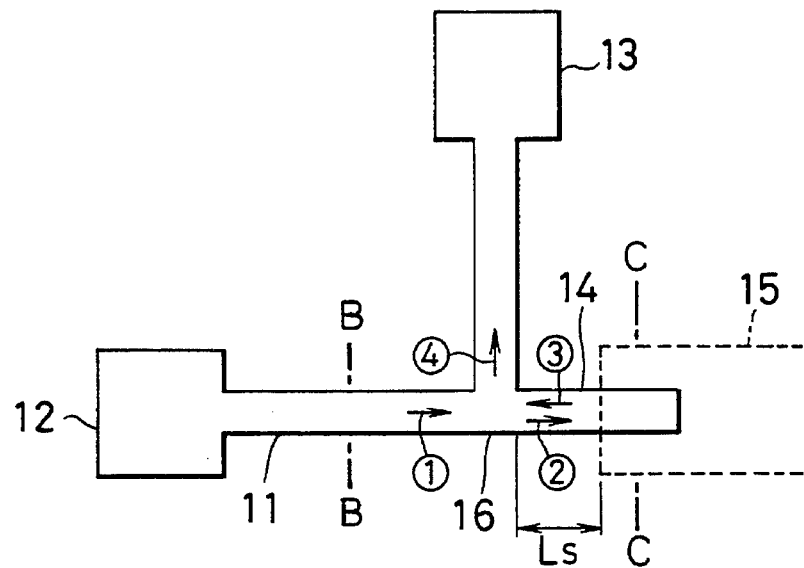
FIG. 1A is a schematic plan view of the essential part of a conventional quantum interference device.
Figure 1B:
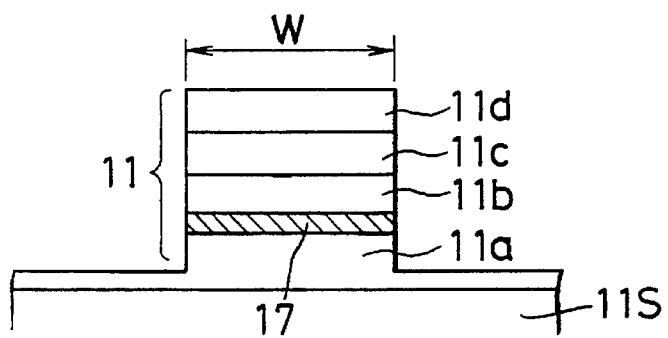
FIGS. 1B and 1C are schematic sectional views taken along the lines B—B and C—C, respectively, of FIG. 1A.
Figure 1C:
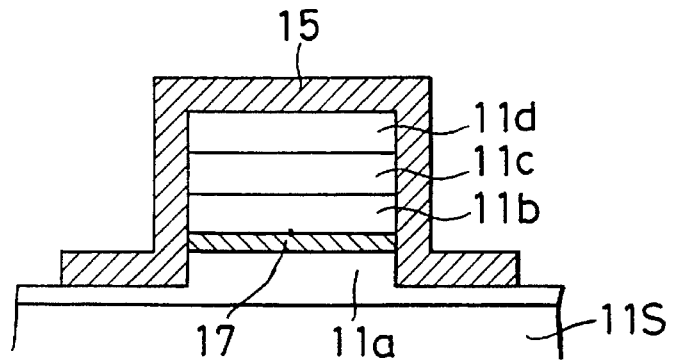

From FIG. 2A, it appears that there are gaps between the second split gate electrode 7 and the stub gate electrode 9 and between the third split gate electrode 8 and the stub gate electrode 9, and that the quantum wire 3 is not closed. Actually, however, a closed quantum wire 3 is formed because the depletion regions extend from the respective gate electrodes and overlap each other. Since the width of the quantum wire 3 is defined by the extent of the depletion regions, the device of FIG. 2A is free from adverse influences from the side walls, unlike the conventional device of a mesa type shown in FIGS. 1A to 1C. The elastic mean free path and the inelastic mean free path vary depending on the quality of the epitaxially grown layers constituting the semiconductor heterostructure, but the elastic mean free path is from 1 nm to several µm, while the inelastic mean free path ranges from 100 nm to several µm. Therefore, the element length needs to be about a tenth of the elastic mean free path and the inelastic mean free path. The carrier concentration and mobility of the two-dimensional electron gas (2DEG) are $4.2 \times 10^{11}$ $cm^{-2}$ and $2.1 \times 10^5$ $cm^2$/V-sec at 4.2K, respectively, corresponding to an electron mean free path of 2.1 µm.

Figure 3:
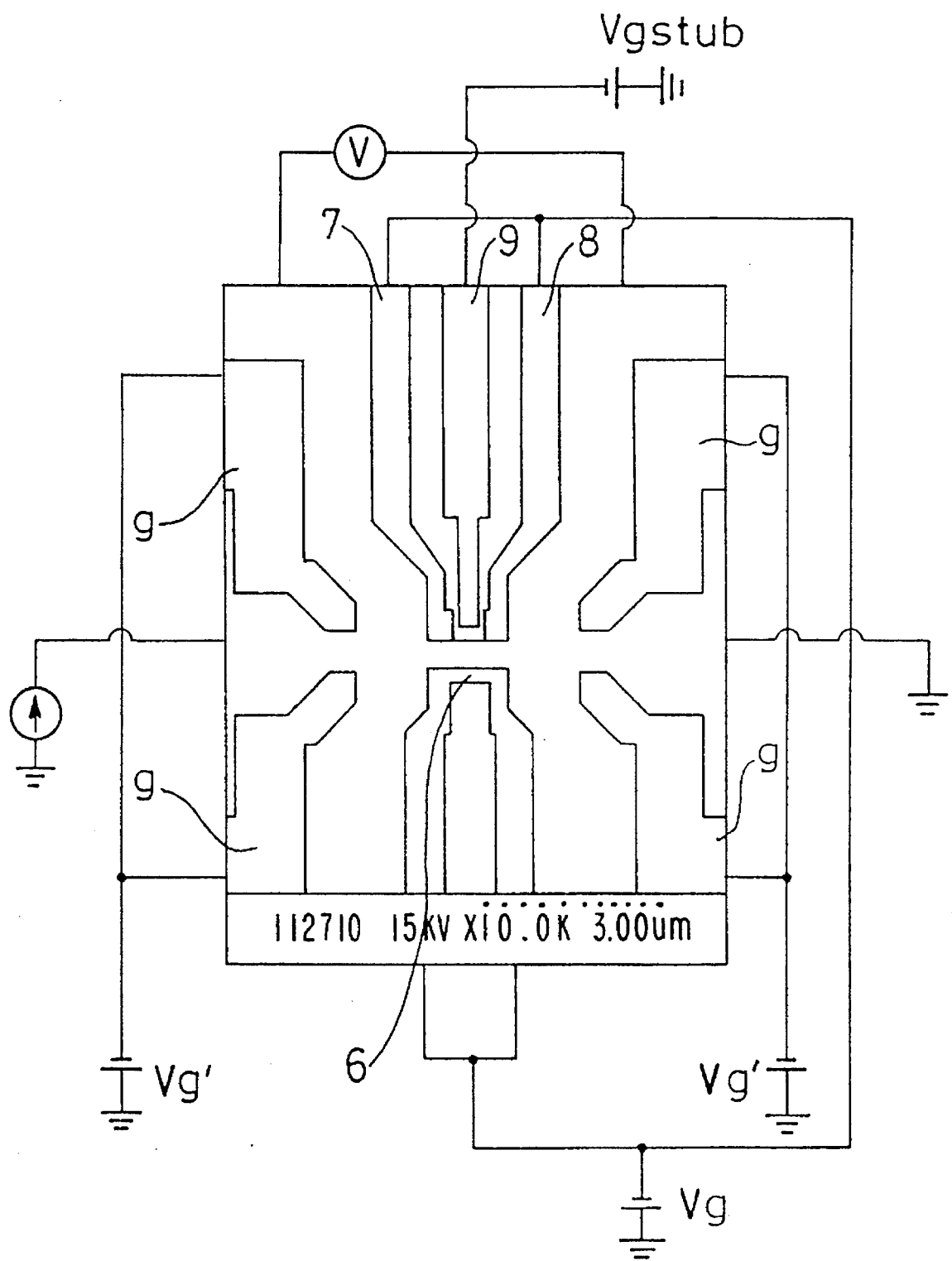
FIG. 3 is a scanning electron micrograph of the device produced.
Figure 4:
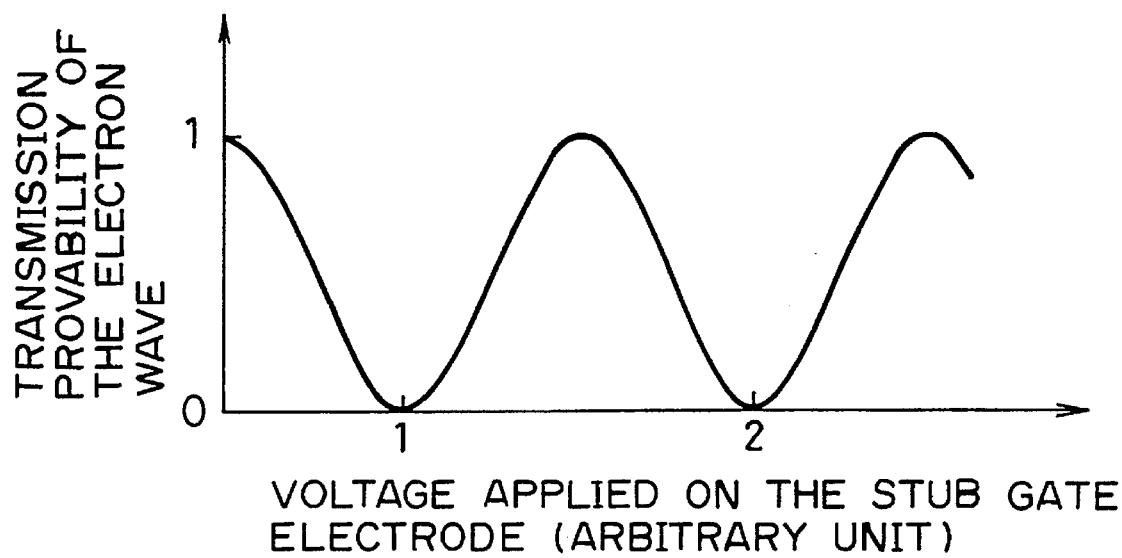
FIG. 4 is a graph showing the stub gate voltage control characteristics of transmission probability of the electron wave in the device according to the present invention.

FIG. 3 includes an SEM micrograph of a fabricated device, wherein Vg is the voltage of the split gate electrodes 7, 8 forming a quantum wire, Vg' is the voltage of the gate electrodes g which are provided to form the entrance and exit of the current path, and Vg stub is the voltage of the stub gate electrode 9. In this device, the two-dimensional electron gas beneath the split gate was depleted at $V_g=0.3$ V. By a further decrease of the split-gate voltage Vg the one-dimensional channel could be completely pinched off at $V_g=-1.2$ V Next, operation of the device illustrated in FIGS. 2A and 2B will be described. An electron wave transmitted from the entrance 1 passes through the quantum wire 3 and reaches the branched portion 4. The electron wave that has reached the branched portion 4 is partly reflected and partly transmitted through the protruding stub 5 and partly transmitted to the exit 2. The partial electron wave is reflected at a rear end of the stub 5 and returned to the branched portion 4. A part of this electron wave is transmitted into the quantum wire 3 and interferes with a progressive wave transmitted in the direction of the wire. At this time, depending on the length L of the protruding stub 5 and a voltage fed to the stub gate electrode 9, the part of the electron wave having returned to the branched portion 4 may be in phase or opposite in phase with the progressive wave. In the former case, the waves that have interfered overlap, and thus most energy components of the waves arrive at the exit 2. In the latter case, when the waves have interfered, they counteract each other, and hence most energy components of them are reflected at the branched portion 4. That is, if the effective stub length is controlled by the voltage applied to the stub gate electrode 9, the transmission probability of the electron wave can be varied periodically as shown in FIG. 4. This provides the possibility for modulating conductance periodically. In short, the device of the instant embodiment is capable of 3-terminal operation.

Figure 5:
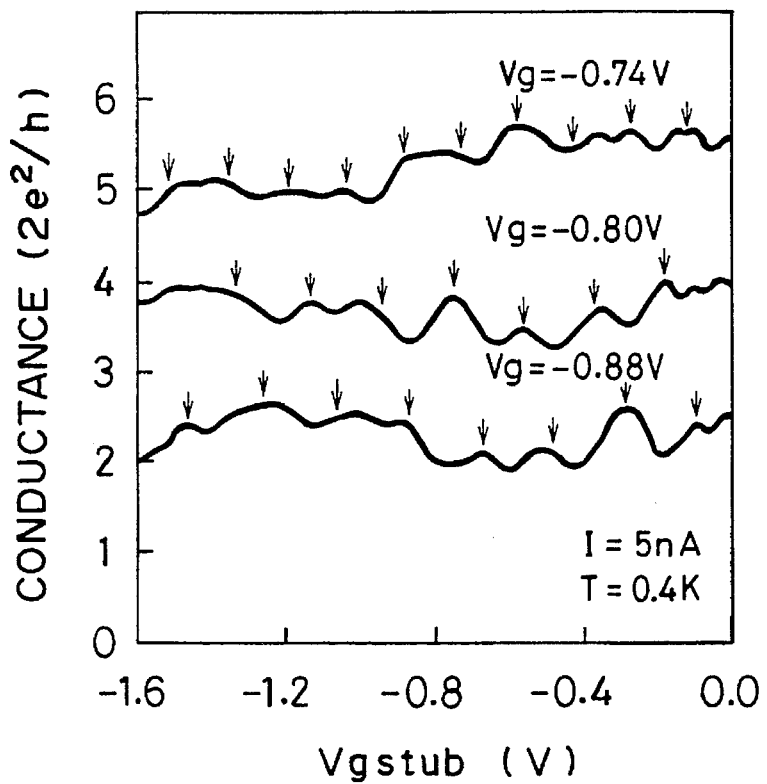
FIG. 5 is a diagram showing conductance of the device as a function of voltage applied to the stub gate electrode for several split-gate voltages.

FIG. 4 is a graphical diagram, while the resistances of the device illustrated in FIG. 3 were actually measured. The measurement was made using a low-frequency four-terminal AC technique with a lock-in amplifier. In FIG. 5, conductances, G, obtained by inverting the measured resistances are plotted as a function of the stub gate voltage, $V_{gstub}$, for a variety of different split-gate voltages, $V_g$, at 0.4K. The second and third curves from the bottom have offsets of, respectively $1(2e^2/h)$ and $2 (2e^2/h)$. Clear conductance oscillations as a function of $V_{gstub}$ were observed. In FIG. 5, arrows indicate the period of conductance oscillations. The line for G-$V_{gstub}$ characteristics on which the oscillations were superimposed was almost constant in the $V_{gstub}$ sweeping range between −1.6 V and 0 V. This result suggests that the transverse mode number is almost constant in this range.

The foregoing embodiment describes the formation of semiconductor heterojunctions for the production of the quantum wire by sequentially stacking the undoped GaAs layer 3a, the ud-AlGaAs buffer layer 3b, the n-AlGaAs electron donor layer 3c, and the $n^+$-GaAs cap layer 3d on the semi-insulating GaAs substrate 20. However, the semiconductor heterojunctions are not limited to this embodiment. For instance, the following can be used for the production of a quantum wire: an InAlAs/InGaAs system formed by sequentially stacking a ud-InGaAs layer, a ud-InAlAs buffer layer, an n-InAlAs electron donor layer, and an $n^+$-InGaAs cap layer on a semi-insulating InGaAs substrate; an InAlAs/InP system formed by sequentially stacking a ud-InP layer, a ud-InAlAs buffer layer, an n-InAlAs electron donor layer, and an $n^+$-InGaAs cap layer on a semi-insulating InP substrate; an AlGaAs/InGaAs system formed by sequentially stacking a ud-InGaAs layer, a ud-AlGaAs buffer layer, an n-AlGaAs electron donor layer, and an $n^+$-GaAs cap layer on a semi-insulating InGaAs substrate; an AlSbAs/InAs system formed by sequentially stacking a ud-InAs layer, a ud-AlSb buffer layer, an n-AlSbAs electron donor layer, and an $n^+$-GaSb cap layer on a semi-insulating InAs substrate; an InAs/AlGaSb system formed by sequentially stacking a ud-InAs layer, a ud-AlGaSb buffer layer, an n-AlGaSb electron donor layer, and an $n^+$-GaSb cap layer on a semi-insulating InAs substrate; and other semiconductor heterojunctions.

Next, the operations of the quantum interference device according to the present invention used as a switching element will be described.

Figure 6:
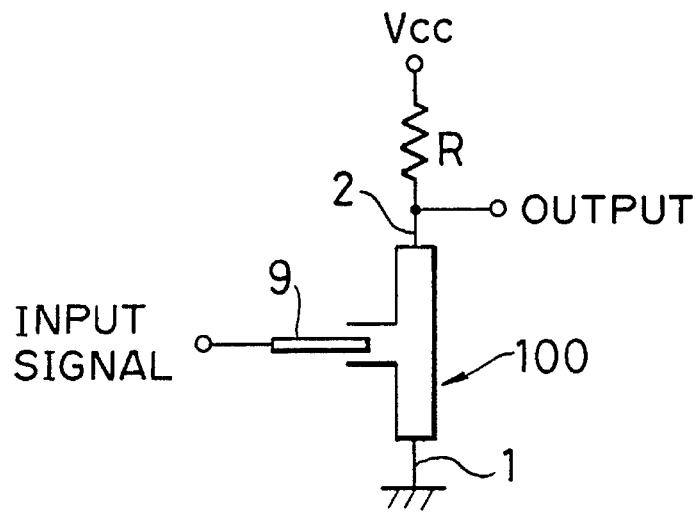
FIG. 6 is a block diagram of the quantum interference device according to the invention used as a switching element.
Figure 7:
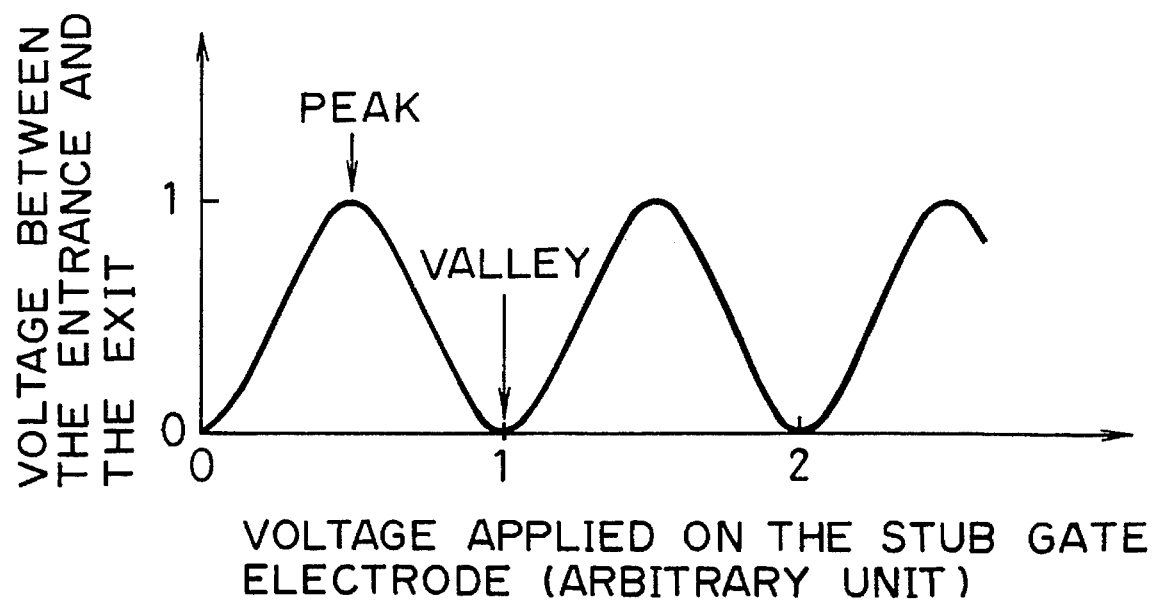
FIG. 7 is a graph showing changes in voltage between the entrance and the exit due to voltage applied to the stub gate electrode in the switching element of FIG. 6.

FIG. 6 is a block diagram of a quantum interference device 100 according to the present invention used as a switching element, in which R denotes a resistor element and Vcc denotes a power source voltage. The reference numerals 1, 2 and 9 correspond to the entrance 1, exit 2 and stub gate electrode 9, respectively, in FIG. 2A. A voltage applied to the stub gate electrode 9 (input) permits the modulation of an output voltage as shown in FIG. 7. Therefore, the device can be used as a switching element if the peaks and the valleys are taken as "1" and "0", respectively. Furthermore, since the quantum interference device 100 of the present invention is small in size the logic swing voltage is small, and thus it can perform a high speed and low power consumption operation.

With referring to FIGS. 8A to 8C, the operation of the quantum interference device 100 according to the present invention serving as a frequency multiplier will be explained. When an input as illustrated in FIG. 8B is applied to the stub gate electrode 9 of the quantum interference device 100 having input (input to stub gate electrode 9)-output control characteristics as shown in FIG. 8A, one period of the input is modulated into 4 periods at the output as shown in FIG. 8C. That is, the frequency of an input signal to the stub gate electrode is outputted as a 4-fold value.

As described above, the quantum interference device of the present invention has small dimensions relative to the elastic mean free path and inelastic mean free path of electrons, and has a quantum wire comprising an ultrathin wire having an entrance and an exit for an electron wave, and a protruding stub in a branched portion in the middle of the ultrathin wire. The quantum wire is formed by forming depletion regions beneath the split gate electrodes by applying a negative voltage to the split gate electrodes formed on the surface of epitaxially grown layers of a semiconductor heterostructure. Moreover, a stub gate electrode for defining the rear end of the stub is constructed such that a voltage can be applied thereto separately. Thus, the effective channel width of the stub structure can be controlled, and the stub length is also controllable independently. Hence, a three-terminal device can be achieved in which the entrance-to-exit transmission probability of an electron wave, i.e. the conductance of the element, can be modulated.

Figure 9A:
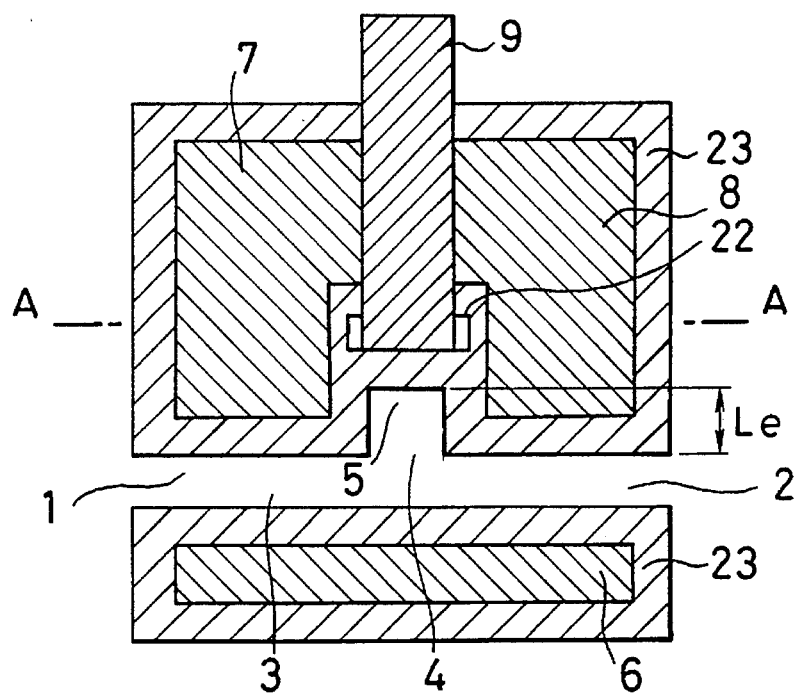
FIG. 9A is a schematic plan view of a second embodiment of the quantum interference device in accordance with the present invention.
Figure 9B:
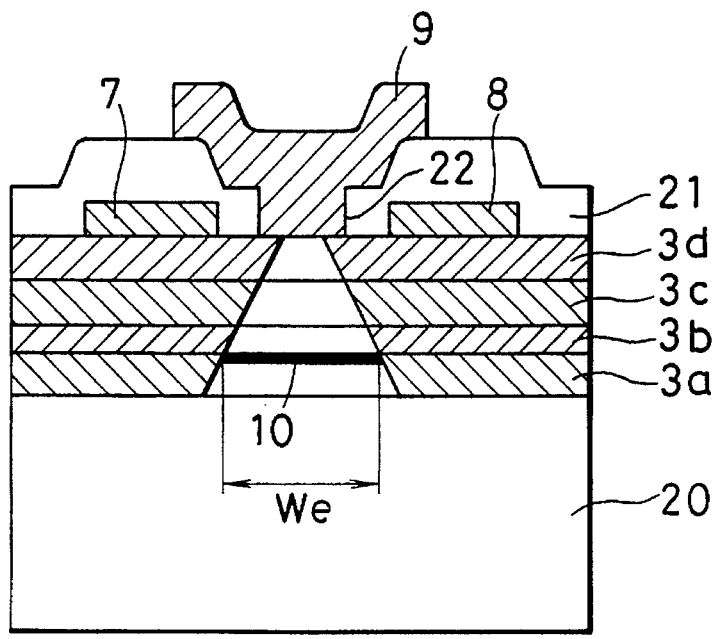
FIG. 9B is a sectional view taken along the line A—A of FIG. 9A.

FIG. 9A is a schematic sectional view of a second embodiment of the quantum interference device according to the present invention. FIG. 9B is a sectional view taken along the line A—A of FIG. 9A. The shapes of second and third split gate electrodes 7 and 8 in the embodiment of FIG. 9A are different from those of the split gate electrodes shown in FIG. 2A. However, these electrodes 7 and 8 have sides parallel to a side of a first split gate electrode 6, and have a side parallel to the corresponding side of each other, and their functions are the same as described in FIGS. 2A and 2B. Split gate electrodes 7 and 8 may be an integral structure or may be connected with each other. FIG. 9A displays the extent of a depletion region 23. A main difference between the instant embodiment and the first embodiment is in the method of forming a stub gate electrode 9. In the first embodiment, the semiconductor heterostructure is formed, whereafter the three split gate electrodes 6,7,8 and the stub gate electrode 9 were simultaneously formed on the same surface. In the instant embodiment, Schottky electrodes 6,7,8 are formed on an $n^+$-GaAs cap layer 3d. Then, an insulating film 21 having a through-hole 22 is formed thereon, and a Schottky electrode or stub gate electrode 9 is formed which fills the through-hole 22 and is contacted with the cap layer 3d. Such a multi-layer structure comprising the split gate electrodes 6, 7,8 for forming the quantum wire 3 and the stub gate electrode 9 for controlling the effective length Le of the stub 5 ensures a high freedom of wiring.

The operation of the instant embodiment is the same as in the first embodiment, and permits the conductance of the device to be modulated. It also enables the device to be used as a switching element and a frequency multiplier.

Figure 10A:
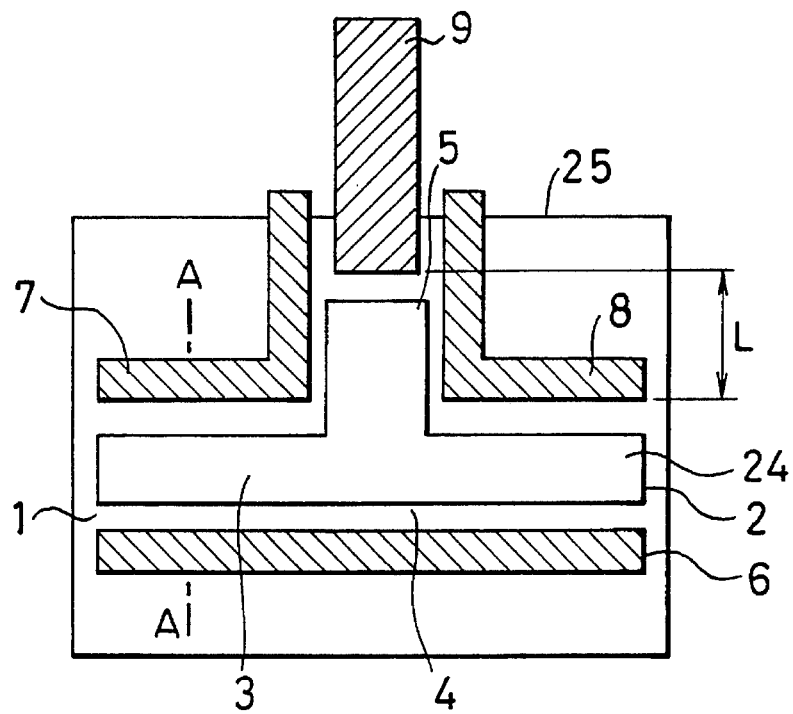
FIGS. 10A and 10B are, respectively, a schematic plan view for explaining a third embodiment of the present invention, and a sectional enlarged view taken along the line A—A of FIG. 10A.
Figure 10B:
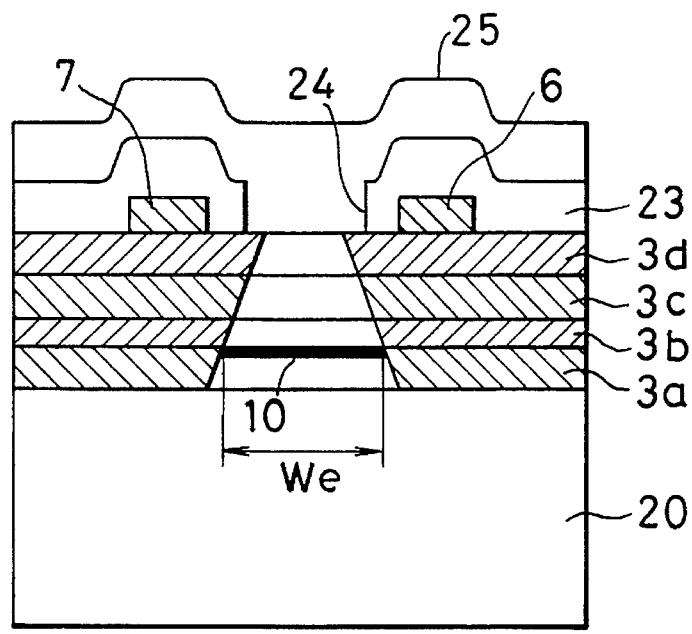

FIG. 10A is a plan view of the essential part of a third embodiment of the quantum interference element according to the present invention, and FIG. 10B is a sectional view taken along the line A—A of FIG. 10A. The main differences between the instant embodiment and the first embodiment illustrated in FIGS. 2A, 2B are as follows: In the instant embodiment, an insulating film 23 having a through-hole 24 is formed on first, second and third split gate electrodes 6, 7 and 8 and stub gate electrode 9, and a Schottky gate electrode (front gate electrode) 25 made of a Ti-Au alloy is further provided thereon which fills up the through-hole 24 and contacts a cap layer 3d. The shape of the through-hole 24 is practically the same as that of a quantum wire 3 which is defined by depletion regions. The functions of the split gate electrodes 6,7,8 and the stub gate electrode 9 in this embodiment are exactly the same as in the first embodiment. That is, the aforementioned conductance modulation, switching operation, and frequency multiplying operation are possible in a state in which no voltage is applied to the front gate electrode 25. In this embodiment, moreover, the modulation periods of conductance can be controlled by a voltage applied to the front gate electrode 25.

In the element illustrated in FIGS. 10A, and 10B, the voltage applied to the stub gate electrode 9, $\Delta V_{gstub}$, required to vary the conductance of the element by one period can be expressed by the following Equation (1).

$$\Delta V_{gstub} = \lambda_F/2 \cdot 1/(\delta V_{gstub}) \tag{1}$$

where $\lambda_F$ is an Fermi wavelength, Leff is an effective stub length, and $V_{gstub}$ is a voltage applied to the stub gate electrode 9. Since $\lambda_F = 4/n_{10}$, moreover, Equation (1) can be rewritten as Equation (2), in which $n_{10}$ is the one-dimensional electron density of the channel.

$$\Delta V_{gstub} = 2/n_{10} \cdot 1/(\delta Leff/\delta V_{gstub}) \tag{2}$$

From Equation (2), it can be seen that if the electron concentration $n_{10}$ of the wire channel is increased (the Fermi wavelength is shortened) by applying a positive voltage to the Schottky gate electrode (front gate electrode) 25 provided on the whole or part of the surface of the wire channel, the modulation period of conductance, $\Delta V_{gstub}$, becomes short; if $n_{10}$ is decreased (the Fermi wavelength is lengthened) by applying a negative voltage, the modulation period becomes long. Namely, the period of the "conductance-voltage applied to the stub gate, $V_{gsub}$," characteristics can be set at a desired value.

Figure 11:
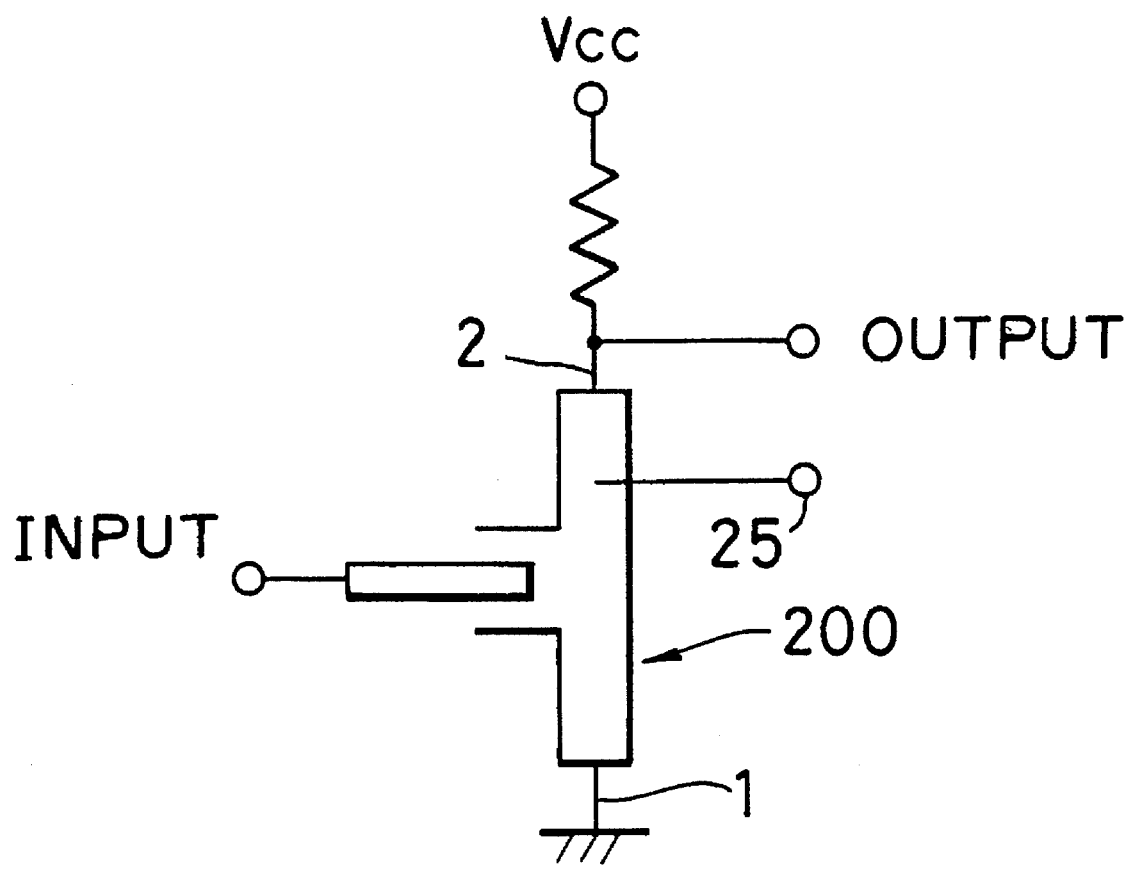
FIG. 11 is a block diagram showing the manner in which the third embodiment is used.
Figure 12A:
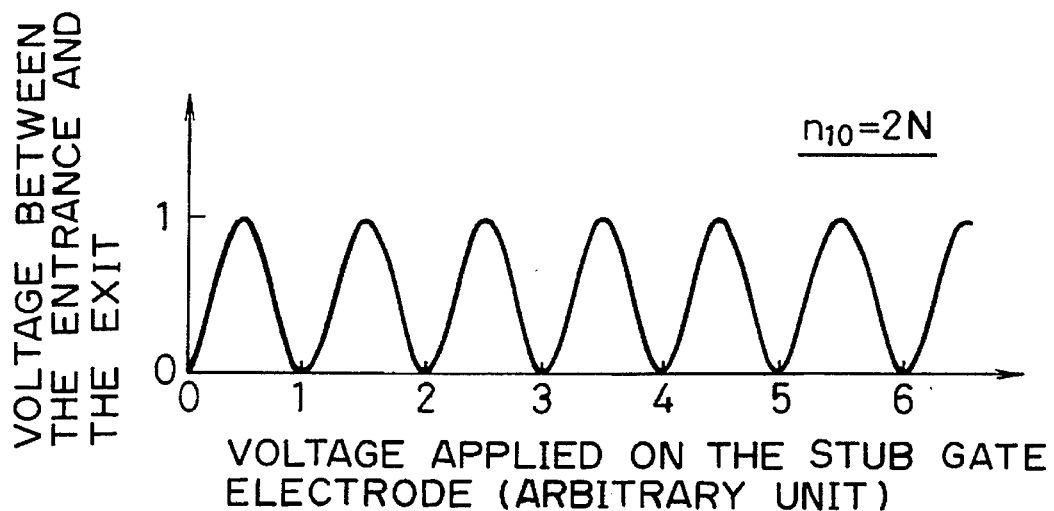
FIGS. 12A–12C are each a wave form graph showing the relationship between voltage applied to the stub gate electrode and the voltage between the entrance and the exit.
Figure 12B:
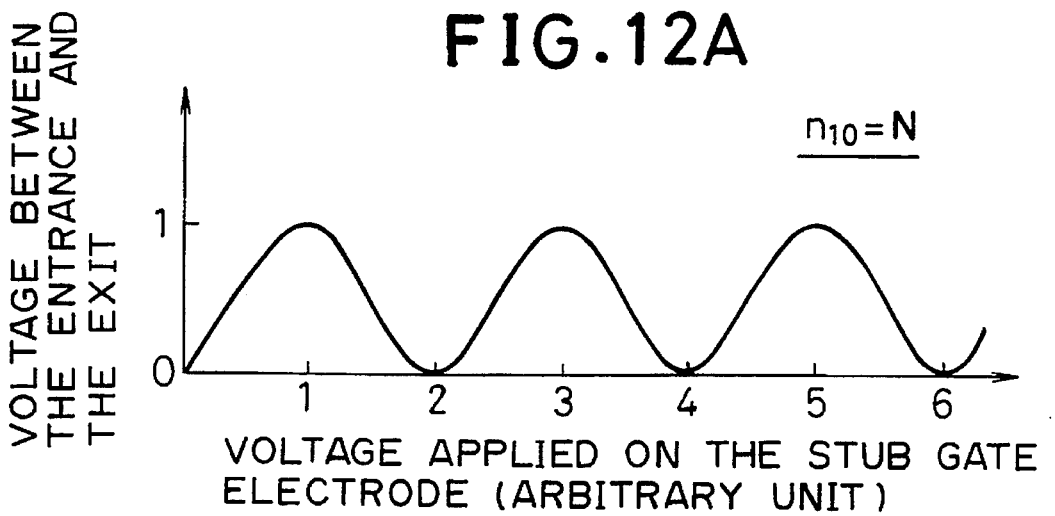
Figure 12C:
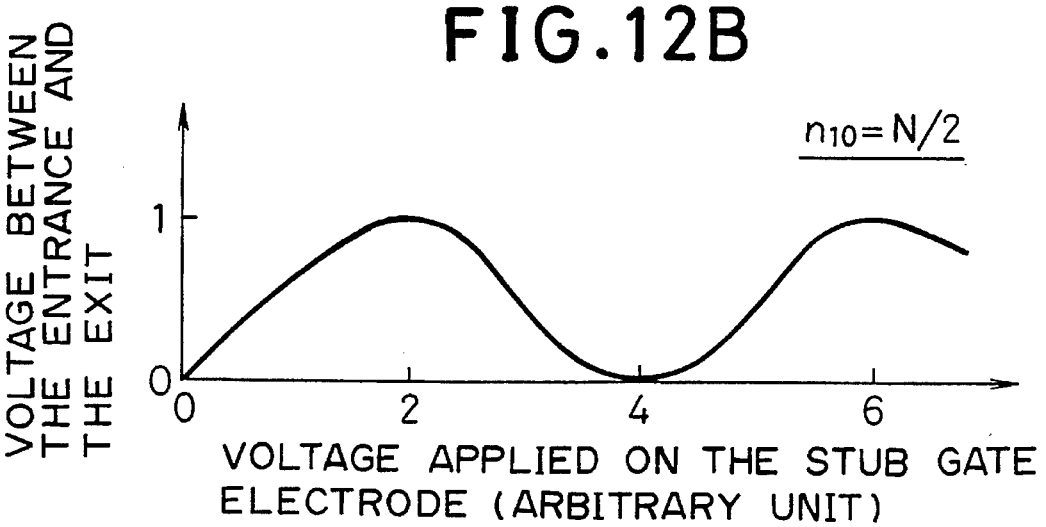

The quantum interference device 200 illustrated in FIGS. 10A and 10B is connected as shown in FIG. 11. Vcc denotes a power source voltage, and the reference numerals 1, 2, 9 and 25 correspond to the entrance 1, exit 2, stub gate electrode 9 and front gate electrode 25, respectively, shown in FIG. 10A. Assume, here, that the electron concentration that gives the characteristics of FIG. 12B is N. If the electron concentration is made 2N by controlling the voltage fed to the front gate electrode 25, the period is halved as shown in FIG. 12A. If the electron concentration is made N/2, the period is doubled as shown in FIG. 12C.

Figure 13A:
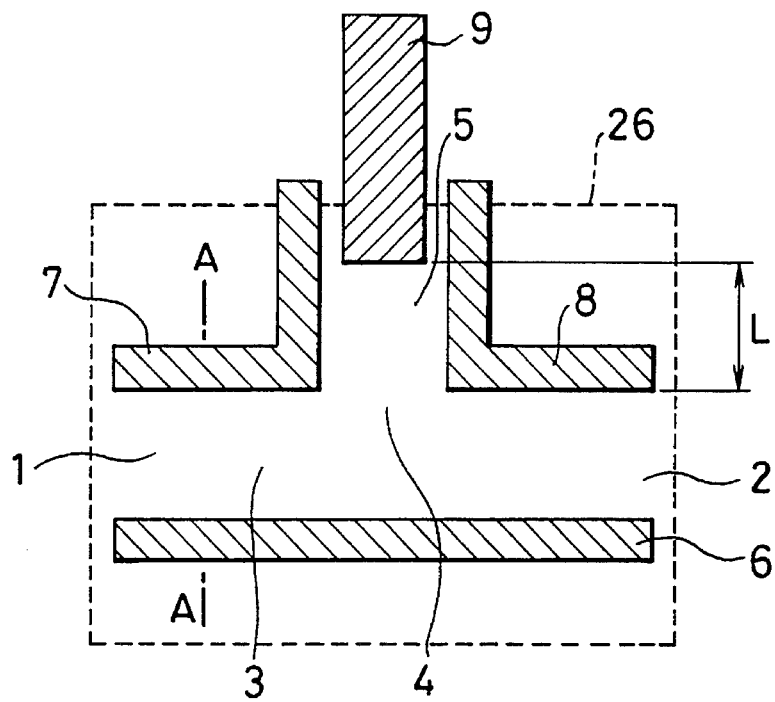
FIGS. 13A and 13B are, respectively, a schematic plan view for explaining a fourth embodiment of the present invention, and a sectional enlarged view taken along the line A—A of FIG. 13A.
Figure 13B:
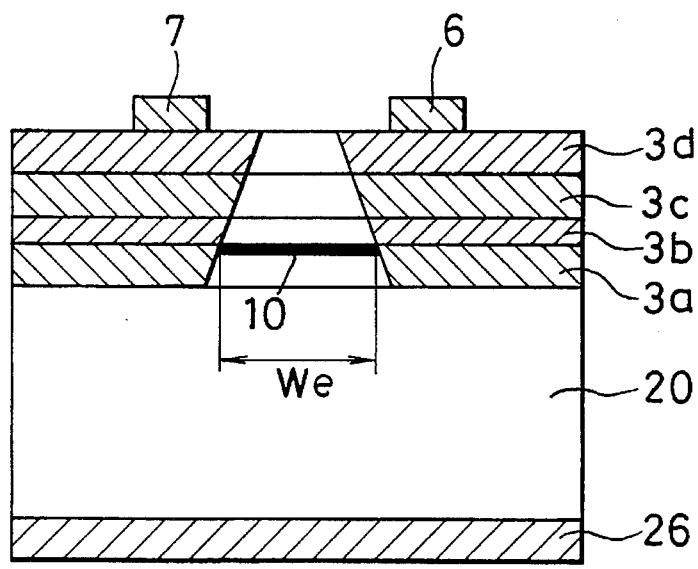

A fourth embodiment of the present invention will be described by reference to FIGS. 13A and 13B. FIG. 13A is a schematic plan view of the essential part of this embodiment, and FIG. 13B is a sectional view taken along the line A—A of FIG. 13A. This embodiment is different from the aforementioned third embodiment only in that no front gate electrode (Schottky gate electrode) 25 and the insulating film 23 is provided, but a back gate electrode 26 is provided on the entire surface of a substrate 20. That is, according to the device of the instant embodiment, the modulation period of conductance is controlled not by a voltage applied to the front gate electrode, but by a voltage applied to the back gate electrode 26.

As described above, the quantum interference devices in the third and fourth embodiments of the present invention have a channel electron concentration control means provided in a quantum wire three-terminal element of a stub structure having periodical control characteristics. Thus, they have made it possible to vary only the periods of "conductance-control voltage" without changing the mode number, by controlling the electron concentration in the channel. The third embodiment which controls the channel electron concentration by a Schottky gate electrode is advantageous for integration, because a front gate electrode is used. The fourth embodiment which controls the channel electron concentration by a back gate electrode is capable of finely adjusting the electron concentration of the channel. The conductance of the devices of the foregoing examples can be modulated at temperatures up to 2K.

Figure 14:
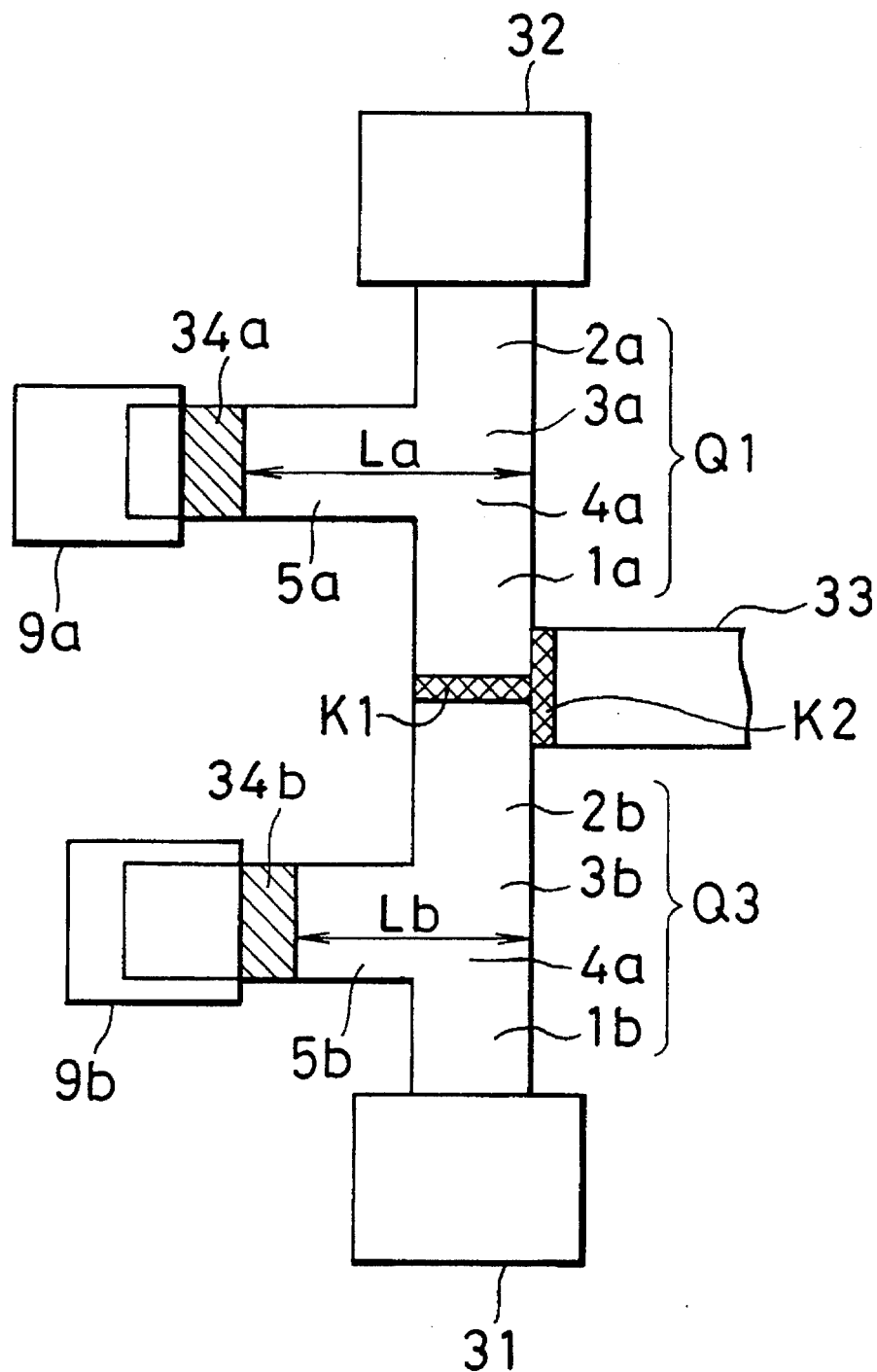
FIG. 14 is a plan view showing the structure of a complementary inverter, a first embodiment of the complementary logic circuit of the present invention.

FIG. 14 is a plan view showing the device structure of a complementary inverter, a first embodiment of the complementary logic circuit according to the present invention. This embodiment is composed of a normally-on type quantum interference transistor Q1 and a normally-off type quantum interference transistor Q3 connected together. A stub-structured quantum wire, which has a simple structure and thus is easy to produce, is used as a component of the quantum interference transistors Q1, Q3. Any of the aforementioned first to fourth embodiments of the quantum interference device are preferably used. The quantum interference transistor Q1 has a quantum wire 3a including an entrance portion 1a, an exit portion 2a, a branched portion 4a and a stub 5a, and has a control terminal 9a comprising a Schottky gate electrode formed on the edge of the stub 5a. Similarly, the quantum interference transistor Q3 has a quantum wire 3b including an entrance portions 1b, an exit portion 2b, a branched portion 4b and a stub 5b, and has a control terminal 9b comprising a Schottky gate electrode formed on the edge of the stub 5b. The quantum interference transistors Q1 and Q3 are connected in series via means K1 which destroys phase coherence, and the transistor Q3 is provided with a source electrode 31, while the transistor Q1 is provided with a drain electrode 32. The junction of the two transistors is provided with an output terminal 33 via means K2 which destroys phase coherence. The effective lengths La and Lb of the stubs are defined by depletion regions 34a and 34b, respectively. K1 and K2 will be described later on.

In the complementary inverter illustrated in FIG. 14, the dimensions of each quantum interference transistor, namely the element dimensions of the quantum wire 3a or 3b, are set to be sufficiently small compared with the elastic mean free path and inelastic mean free path of electrons, as described previously. The conduction of electrons is ballistic, and the respective lengths from the entrance to the exit of each transistor are coherent. It is not permissible to connect both transistors to be coherent. The means K1 for destroying phase coherence has been provided to avoid such connection. To obtain ideal operation, the quantum wire is preferably of a single mode.

The connection of the quantum interference transistors Q1 and Q3 may be reverse; namely the exit of the transistor Q1 and the entrance of the transistor Q3 may be connected together.

According to the theoretical calculation by T. Ito et al. (T. Ito, N. Sano and A. Yoshii: Extended Abstract 1992, Int. Conf. Solid State Devices and Materials, Tsukuba, 1992, pp. 753–755), the conductance characteristic of a quantum wire with a stub structure has the following feature: Every time the stub length L becomes a half-integer multiple of the electron wavelength $\lambda$, i.e., whenever the condition $$L/(\lambda/2)=N \ (N \text{ is an integer})$$

is satisfied, conductance takes a minimal value.

Attention has been paid to this feature in the present invention. In the quantum wire 3a with a stub structure illustrated in FIG. 14, when a control signal to be inputted into the control electrode 9a is "0" according to a binary representation, the stub length La has the following relationship with the electron wavelength $\lambda$ $$La=(\lambda/4)(2m+1) \ (m \text{ is 0 or an integer})$$

whereby the normally-on type interference transistor Q1 has been constructed.

In the quantum wire 3b with a stub structure, moreover, when a control signal to be inputted into the control electrode 9b is "0" according to a binary representation, the stub length Lb has the following relationship with the electron wavelength $\lambda$ $$Lb=(\lambda/4)(2n) \ (n \text{ is an integer})$$

whereby the normally-off type interference transistor Q3 has been constructed.

Furthermore, the value of the control signal corresponding to "1" according to a binary representation has been set at such a value that the stub length in the "0" state is changed by $\lambda/4$ in the normally-on or normally-off type interference transistor.

Figure 15A:
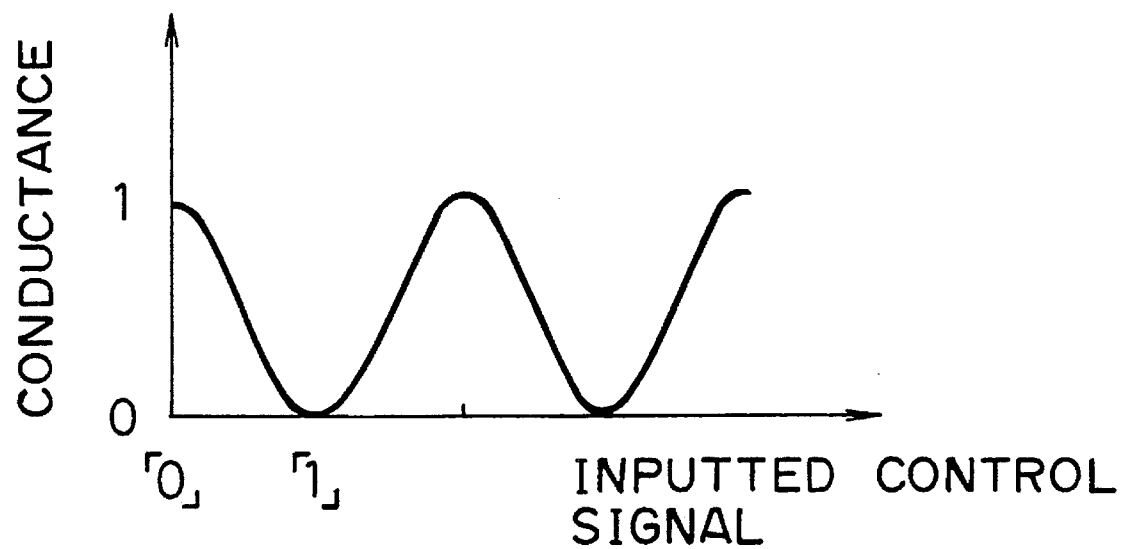
FIGS. 15A and 15B are wave form graphs showing the control characteristics of a normally-on interference transistor and the control characteristics of a normally-off interference transistor, respectively, for use in the complementary logic circuit of the present invention.
Figure 15B:
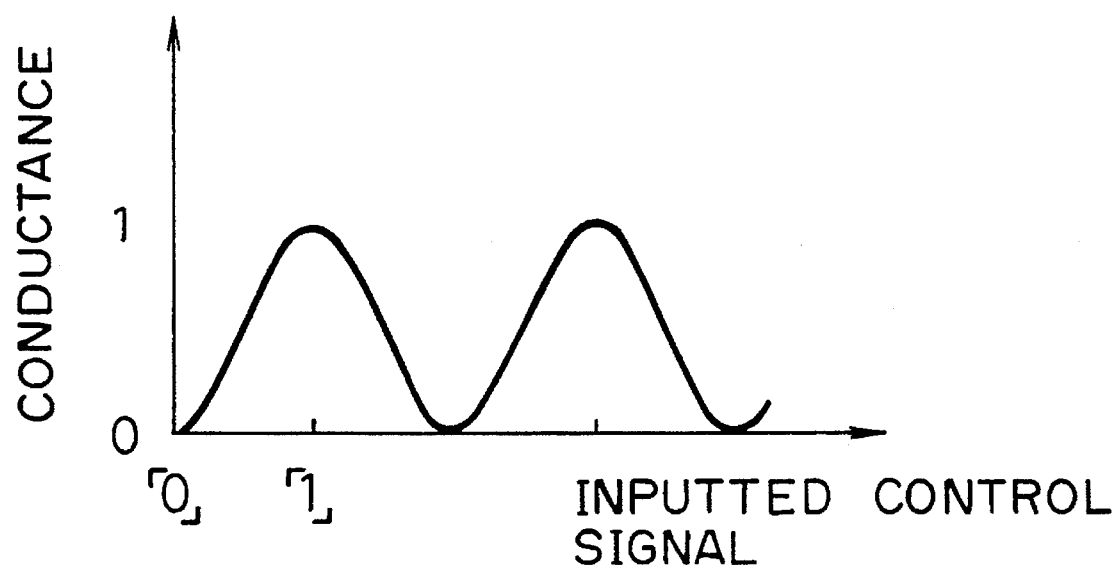

The selection of the stub length and the value of the control signal as described above permits the conductance of the normally-on type interference transistor Q1 and the normally-off type interference transistor Q3 to show control characteristics as illustrated in FIGS. 15A and 15B, respectively. The control characteristics of the Q1 and Q3 are characterized in that when the control signal changes from "0" to "1", the Q1 has a negative transconductance, while the Q3 has a positive transconductance. Conversely, when the control signal changes from "1" to "0", the Q1 has a positive transconductance, while the Q3 has a negative transconductance. That is, the Q1 and Q3 have complementary positive or negative transconductance with respect to the control signal. Thus, the Q1 and Q3 do complementary operations relative to the control signal.

As illustrated in FIGS. 15A and 15B, moreover, even when the control signal represents a binary value of "0" or "1", the channel of one of Q1 and Q3 is "off" in a static condition.

Figure 16:
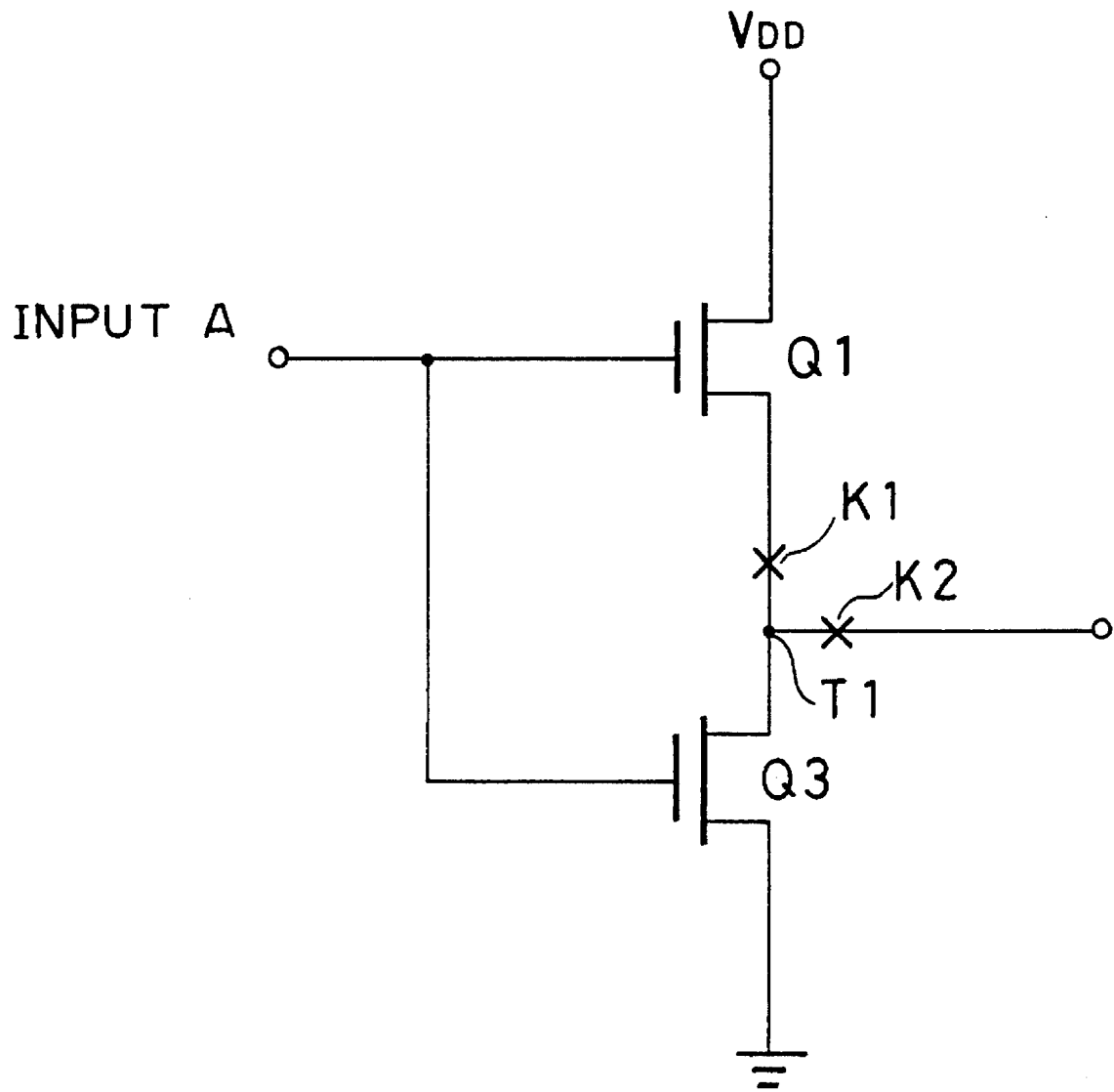
FIG. 16 is a circuit diagram showing an example of use of the embodiment shown in FIG. 14.

FIG. 16 shows the construction of a circuit in which the device structure of FIG. 14 is inserted in series between the power source voltage $V_{DD}$ and the earth (ground). That is, the normally-on type interference transistor Q1 is connected with the power source via a drain electrode, while the normally-off type interference transistor Q3 is connected with the Q1 in series, and connected with the earth electrode via a source electrode. Also, the same control input is fed to the Q1 and the Q3.

TABLE 1

| Input A | "on" or "off" of channel | | Output |
|---|---|---|---|
| | O1 | O3 | |
| "0" | "on" | "off" | "1" |
| "1" | "off" | "on" | "0" |

Table 1 is a table for explaining the operations of the complementary logic circuit illustrated in FIG. 16. As has been described already, the Q1 and the Q3 have the control characteristics shown in FIGS. 15A and 15B. Thus, as summarized in Table 1, the operations are such that when the control input A represents a binary value of "0", the channel of Q1 is turned on, while the channel of Q3 is turned off, producing an output "1" according to a binary representation. When the control input A represents a binary value of "1" the channel of Q1 is turned off, while the channel of Q3 is turned on, generating an output "0" according to a binary representation. That is, the resulting logic circuit operation is an inverter operation. In a static state, moreover, a complementary circuit operation is obtained in which the channel of one of Q1 and Q3 connected in series is turned off. Thus, the consumed power in the static state is very low, and the main consumption of power is in a transient condition. In addition, the interference transistor is used as the basic device, so that the power source voltage is several millivolts at most. In this view, it can be seen that the complementary logic circuit according to the present invention is capable of operations involving extremely low power consumption.

As has been described earlier, the interference transistors Q1 and Q3 are required to be coherent throughout the individual element. If the electron waves are coherent in whole range from Q1 to Q3 when they are connected in series, however, this fact should be taken into consideration in designing the control characteristics of the transistors. In FIG. 14, K1 represents means introduced to destroy coherence between Q1 and Q3.

This means K1 may be, for example, an area having an impurity introduced at a high concentration. By introducing the means K1 destroying the phase coherence between Q1 and Q3, it becomes possible to design Q1 and Q3 as independent units.

K2 in FIG. 16 represents means introduced, based on the same idea, for destroying phase coherence between an output terminal 7 and Q1 and Q3.

According to the present invention, when two kinds of interference transistors using a stub structure quantum wire and having complementary positive or negative transconductance relative to gate voltage are combined as basic elements, basic logic circuits to be constructed using a CMOS circuit can all be realized using nearly the same circuit construction. The complementary inverter circuit illustrated in FIG. 16 presents an example.

Figure 17:
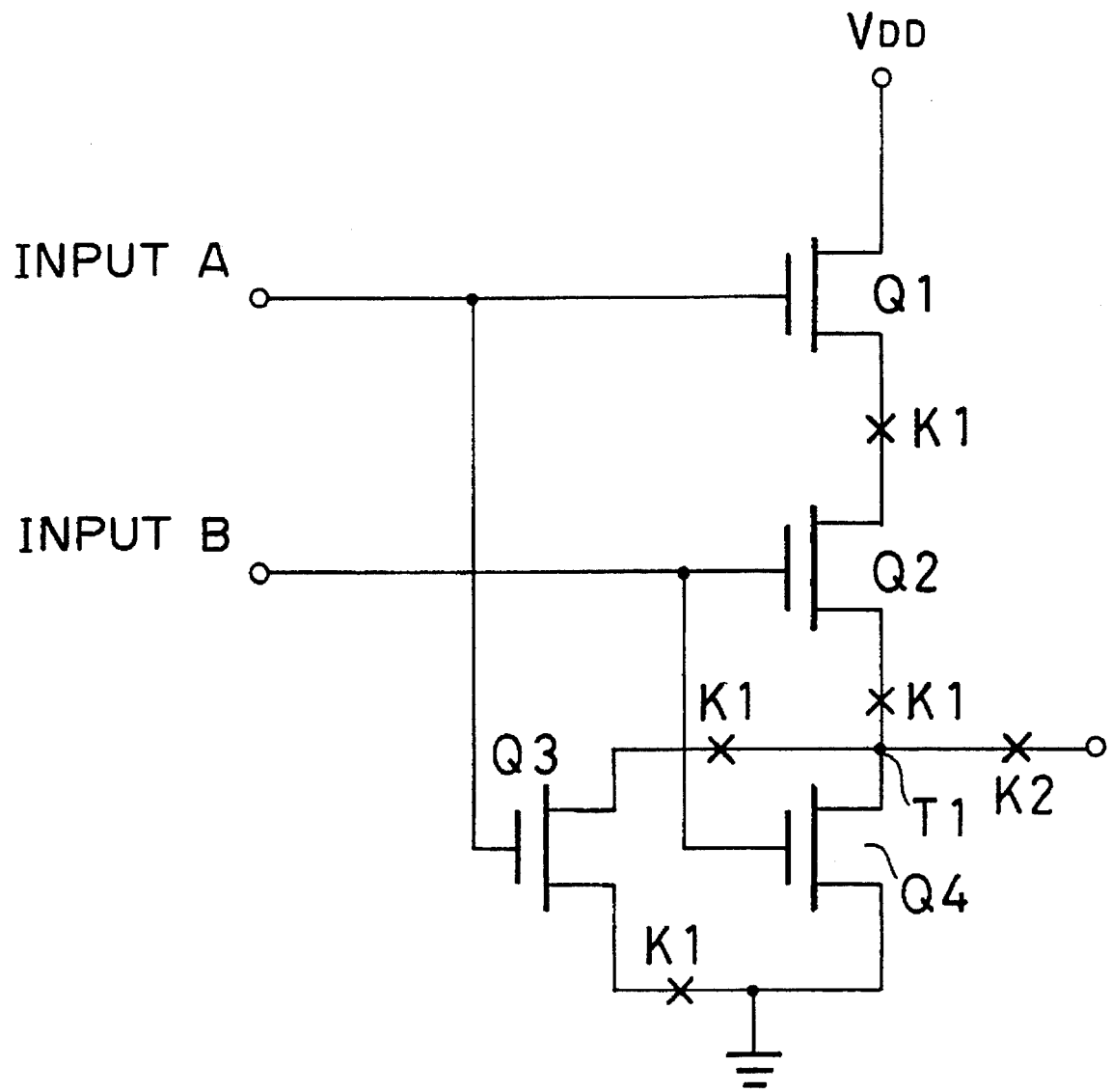
FIG. 17 is a circuit diagram showing a complementary two-input NOR circuit, a second embodiment of the complementary logic circuit of the present invention.

FIG. 17 is a circuit construction diagram for illustrating a second embodiment of the complementary logic circuit according to the present invention. In accordance with the circuit construction of FIG. 17, a complementary 2-input NOR circuit is realized as explained below. In FIG. 17, Q2 is a normally-on interference transistor equivalent to Q1, and Q4 is a normally-off interference transistor equivalent to Q3. Q1 and Q2 are connected in series, while Q3 and Q4 are connected in parallel. Furthermore, the series circuit of Q1 and Q2 (the circuit Q1·Q2) and the parallel circuit of Q3 and Q4 (the circuit Q3+Q4) are connected in series, and the resulting entire series circuit is connected in series between a power source voltage and the earth. Details of this circuit construction will become clear by reference to FIG. 17, and no further explanation is offered here. The symbols K1 and K2 in FIG. 17 are the same as in FIG. 16, and explanations for them are omitted here.

TABLE 2

| Input A | Input B | "on" or "off" of channel | | | | Circuit Q1 · Q2 | Circuit Q3 + Q4 | Output |
|---|---|---|---|---|---|---|---|---|
| | | O1 | O2 | O3 | O4 | | | |
| "0" | "0" | on | on | off | off | on | off | "1" |
| "0" | "1" | on | off | off | on | off | on | "0" |
| "1" | "0" | off | on | on | off | off | on | "0" |
| "1" | "1" | off | off | on | on | off | on | "0" |

Table 2 is a table for explaining the operations of the circuit illustrated in FIG. 17. An output terminal is taken from between the circuit Q3+Q4 and circuit Q1·Q2 that constitute the series circuit. The binary value of output is determined by the "on" or "off" state of the channel of the Q3+Q4 parallel circuit. As seen from Table 2, the circuit construction of FIG. 17 gives a NOR output for inputs A and B.

According to the circuit construction of FIG. 17, moreover, in a static state the channel of one of circuit Q1·Q2 and circuit Q3+Q4 connected in series is off, no matter which value the input signal takes. Namely, a complementary 2-input NOR circuit is realized.

Figure 18:
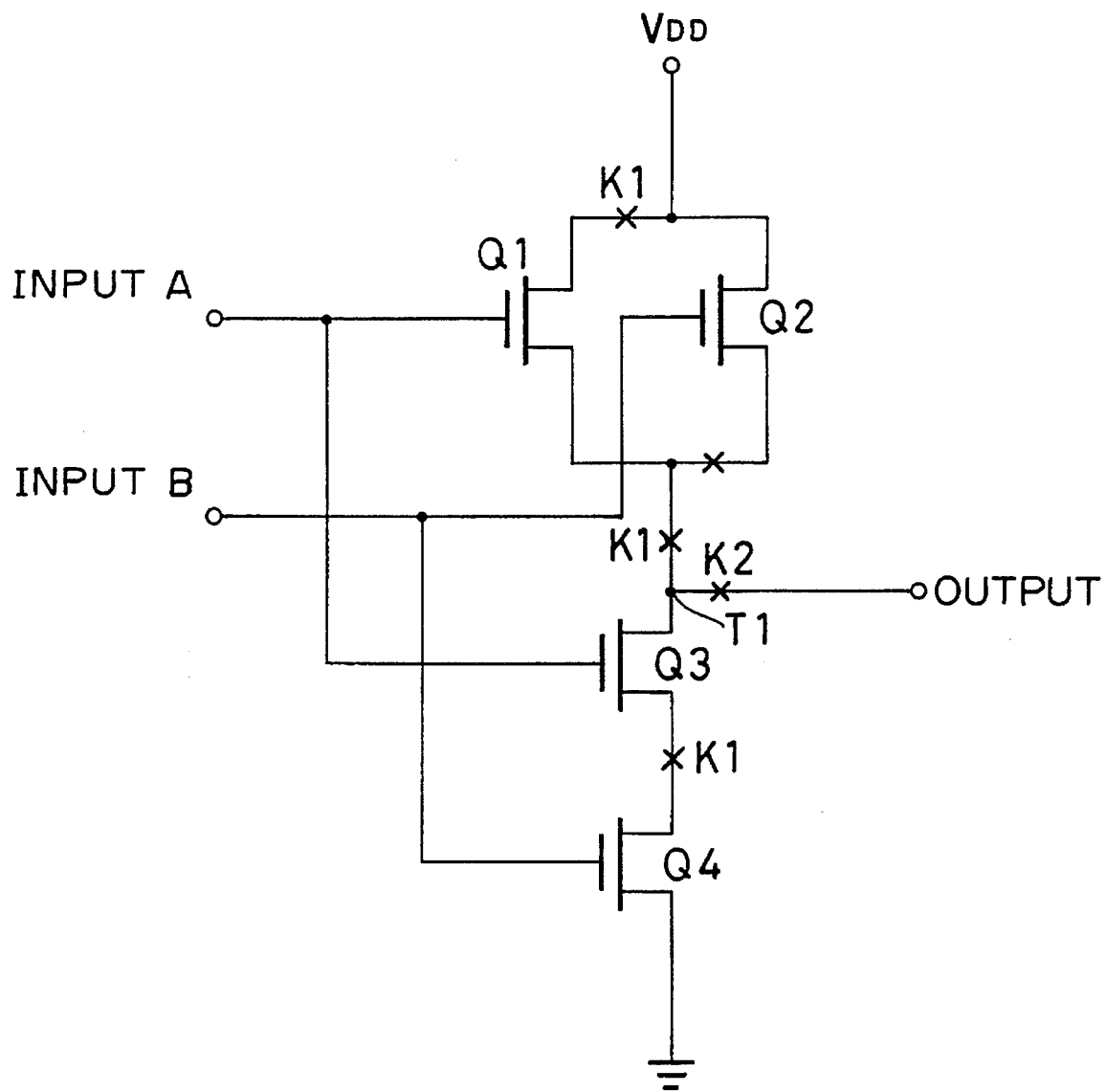
FIG. 18 is a circuit diagram showing a complementary two-input NAND circuit, a third embodiment of the complementary logic circuit of the present invention.

FIG. 18 is a circuit construction diagram for illustrating a third embodiment of the complementary logic circuit according to the present invention. In accordance with the circuit construction of FIG. 18, a complementary 2-input NAND circuit is realized as explained below. In FIG. 18, Q1 and Q2 are normally-on interference transistors as in FIG. 17, while Q3 and Q4 are normally-off interference transistors as in FIG. 17. In FIG. 18, Q1 and Q2 are connected in parallel, constituting a parallel circuit Q1+Q2, while Q3 and Q4 are connected in series, constituting a series circuit Q3·Q4. Furthermore, circuit Q1+Q2 and the circuit Q3·Q4 are connected in series, and the resulting entire series circuit is connected in series between a power source voltage and the earth. The symbols K1 and K2 in FIG. 18 are the same as in FIG. 14, and explanations for them are omitted here.

TABLE 3

| Input A | Input B | "on" or "off" of channel | | | | Circuit Q1·Q2 | Circuit Q3+Q4 | Output |
|---|---|---|---|---|---|---|---|---|
| | | 01 | 02 | 03 | 04 | | | |
| "0" | "0" | on | on | off | off | on | off | "1" |
| "0" | "1" | on | off | off | on | on | off | "1" |
| "1" | "0" | off | on | on | off | on | off | "1" |
| "1" | "1" | off | off | on | on | off | on | "0" |

Table 3 is a table for explaining the operations of the circuit illustrated in FIG. 18. An output terminal is taken from between circuit Q1+Q2 and circuit Q3·Q4 that constitute the series circuit. The binary value of output is determined by the "on" or "off" state of the channel of the Q3·Q4 series circuit. As seen from Table 3, the circuit construction of FIG. 18 gives a NAND output for inputs A and B.

According to the circuit construction of FIG. 18, moreover, in a static state the channel of one of circuit Q1+Q2 and circuit Q3·Q4 connected in series is off, no matter which value the input signal takes. Namely, a complementary 2-input NAND circuit is realized.

Figure 19:
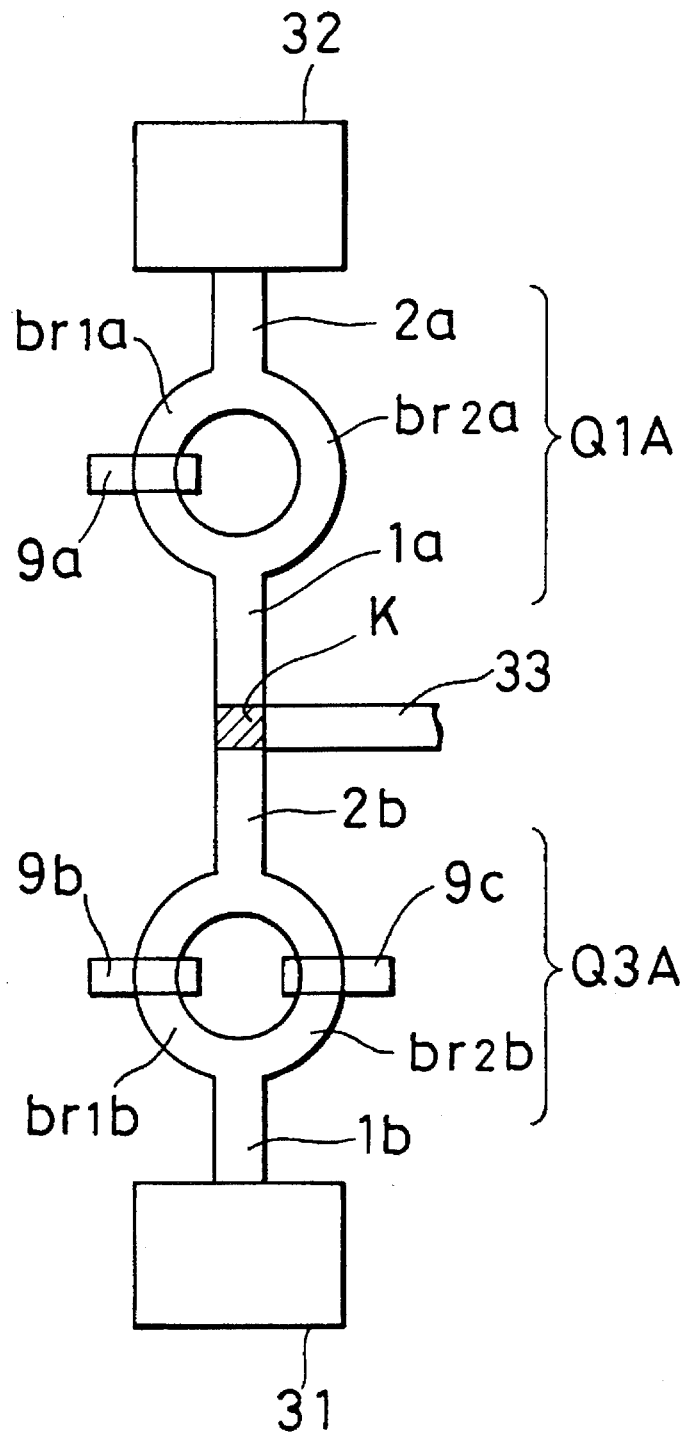
FIG. 19 is a plan view showing the structure of a complementary inverter, a fourth embodiment of the complementary logic circuit of the present invention.

FIG. 19 is a plan view showing the device structure of a complementary inverter as a fourth embodiment of the present invention. This embodiment uses as a constituent of a quantum interference transistor, a planar parallel structure of a simple construction and easy to produce, which comprises a quantum wire. A normally-on quantum interference transistor Q1A assumes a ring structure having a first branch br1a and a second branch br2a, connected in parallel, each branch consisting of a quantum wire. To both ends of this parallel-connected body are connected an entrance portion 1a and an exit potion 2a for electron waves each of which consists of a quantum wire. The first branch br1a and the second branch br2a are symmetric with respect to a central line. Likewise, a normally-off quantum interference transistor Q3A assumes a ring structure having a first branch br1b and a second branch br2b, connected in parallel, each branch consisting of a quantum wire, and an entrance portion 1b and an exit portion 2b, each consisting of a quantum wire. The ring structure is merely an example, and transistors Q1A or Q3A may assume other parallel structures of a square shape, a hexagonal shape, or the like.

The normally-on interference transistor Q1A is constructed as follows: The first branch br1a is provided with a control terminal 9a comprising a Schottky gate electrode. When voltage is applied to the control terminal 9a, the phase of electron waves in the first branch br1a is shifted, thus controlling the conductance of the ring structure. With the normally-on interference transistor Q1A, when the control signal to be inputted into the control terminal 9a represents "0" according to binary representation, the conductance takes a binary value of "1". For the control signal representing "1", the conductance takes a binary value of "0". These control characteristics of the normally-on interference transistor Q1A are shown in FIG. 15A.

The normally-off interference transistor Q3A is constructed as follows: A first branch br1b is provided with a control terminal 9b comprising a Schottky gate electrode. The control terminal 9b is provided with the same control signal as the control signal fed to the normally-on interference transistor Q1A. The normally-off interference transistor Q3A also has on the second branch br2b a gate electrode 9c so that a bias control signal taking a constant value is entered.

By feeding the bias control signal representing a binary value of "1", a normally-off interference transistor is constructed. In detail, when input to the control terminal 9b is "0", the bias control input is always given as "1", thus making the conductance take a binary value of "0". When the control signal is "1", the phase change of electron waves to be given by the control signal and the bias control signal is always an integer multiple of $2\pi$, making the conductance "1". These control characteristics of the normally-off interference transistor Q3A are shown in FIG. 15B.

According to the fourth embodiment of the complementary logic circuit illustrated in FIG. 19, the normally-on interference transistor Q1A and the normally-off interference transistor Q3A are connected in series to construct a complementary inverter, as in the first embodiment illustrated in FIG. 14. In FIG. 19, K denotes means for destroying the phase coherence between Q1A and Q3A and further the phase coherence between the output terminal 33 and each of Q1A and Q3A. This means K is simplified as illustrated, without being separated into $K_1$ and $K_2$ as in FIG. 14.

As described above, the complementary logic circuit of the present invention enables an inverter, a NOR circuit and a NAND circuit to be realized. By combining a plurality of the circuits, all logic functions including AND and OR can be achieved. The complementary logic circuit of the present invention is composed of a normally-on interference transistor and a normally-off interference transistor functioning in a complementary manner, each transistor including a quantum wire of a simple stub or planar parallel structure. These transistors are connected in series via a means for destroying the phase coherence between them, whereby the complementary logic circuit is constructed. The resulting complementary logic circuit is easy to produce and can operate with an extremely low power consumption. Furthermore, the construction of the complementary normally-on and normally-off interference transistor requires no bias circuit, thus presenting with the advantage that the device structure is simple and the circuit construction is easy.

The present invention has been described in detail with respect to preferred embodiments, and it will now be that changes and modifications may be made without departing from the invention in its broader aspects, and it is the intention, therefore, in the appended claims to cover all such changes and modifications as fall within the true spirit of the invention.

What is claimed is:

1. A quantum interference device comprising:

a semiconductor substrate;

a first semiconductor layer, a second semiconductor layer, a third semiconductor layer, and a fourth semiconductor layer as a cap layer, the layers being sequentially deposited on said semiconductor substrate to form semiconductor heterojunctions;

a two-dimensional electron gas channel;

first electrode means, second electrode means and third electrode means for forming a depletion region within the semiconductor heterojunctions by applying a negative voltage thereon thereby making the two-dimensional electron gas channel of a quantum wire of a stub structure comprising an entrance and an exit for electron waves and a stub formed between the entrance and the exit, said first electrode means, said second electrode means and said third electrode means being formed on said semiconductor heterojunctions, said first electrode means having a side extending in a direction parallel to a line connecting the entrance and the exit, said second electrode means and said third electrode means each having a respective first side and a respective second side substantially perpendicular to said respective first side, said first side of said second electrode means and said first side of said third electrode means being substantially parallel to the side of said first electrode means, and said second side of said second electrode means and said second side of said third electrode means being parallel to and confronting each other; and fourth electrode means for defining the effective length of the stub by a voltage applied thereto, said forth electrode means being provided on a site near an edge of said stub.

2. A quantum interference device as claimed in claim 1, wherein said fourth electrode means modulates conductance of the device in accordance with the voltage applied to said fourth electrode means.

3. A quantum interference device as claimed in claim 1, further comprising an insulating film formed on said first electrode means, said second electrode means and said third electrode means, and wherein said fourth electrode means is formed on said insulating film and connected to the semiconductor heterojunctions via a through-hole provided in said insulating film.

4. A quantum interference device as claimed in claim 2, further comprising fifth electrode means for controlling an electron concentration in the quantum wire.

5. A quantum interference device as claimed in claim 4, wherein said fifth electrode means is a Schottky electrode provided on an insulating film having a through-hole of nearly the same shape as that of the stub-structure quantum wire, said insulating film being formed on said semiconductor heterojunctions, and wherein said fifth electrode means is connected to the semiconductor heterojunctions via said through-hole.

6. A quantum interference device comprising:

a semiconductor substrate;

a first semiconductor layer, a second semiconductor layer, a third semiconductor layer, and a fourth semiconductor layer as a cap layer, the layers being sequentially deposited on said semiconductor substrate to form semiconductor heterojunctions;

a two-dimensional electron gas channel;

first electrode means, second electrode means and third electrode means for forming a depletion region within the semiconductor heterojunctions by applying a negative voltage thereon thereby making the two-dimensional electron gas channel of a quantum wire of a stub structure comprising an entrance and an exit for electron waves and a stub formed between the entrance and the exit, said first electrode means, said second electrode means and said third electrode means being formed on said semiconductor heterojunctions, said first electrode means having a side extending in a direction parallel to a line connecting the entrance and the exit, said second electrode means and said third electrode means each having a respective first side and a respective second side substantially perpendicular to said respective first side, said first side of said second electrode means and said first side of said third electrode means being substantially parallel to the side of said first electrode means, and said second side of said second electrode means and said second side of said third electrode means being parallel to and confronting each other;

fourth electrode means for defining the effective length of the stub by a voltage applied thereto and for modulating conductance of the device in accordance with the voltage applied to said forth electrode means, said forth electrode means being provided on a site near an edge of said stub; and fifth electrode means for controlling an electron concentration in the quantum wire, said fifth electrode means being provided on a rear surface of the semiconductor substrate.

7. A quantum interference device as claimed in claim 4, wherein a conductance modulation period of said device can be varied by a voltage applied to said fifth electrode means.

8. A complementary logic circuit comprising:

a normally-on quantum interference device having an entrance and an exit for electron waves and a first control electrode, wherein when a control signal to be inputted into said first control electrode takes a binary value of "0", the conductance takes a binary value of "1", while when the control signal to be inputted into said first control electrode represents "1", the conductance takes "0"; and a normally-off quantum interference device having an entrance and an exit for electron waves and a second control electrode, wherein when a control signal to be inputted into the second control electrode takes a binary value of "0", the conductance takes a binary value of "0", while when the control signal to be inputted into said second control electrode represents "1", the conductance takes "1"; wherein either said entrance of said normally-on quantum interference device and said exit of said normally-off quantum interference device, or said exit of said normally-on quantum interference device and said entrance of said normally-off quantum interference device are connected in series via means for destroying phase coherence between both quantum interference devices.

9. A complementary logic circuit as claimed in claim 8, wherein each of said normally-on and normally-off quantum interference devices includes a quantum wire having a stub-like protrusion, and the first and second control electrodes are provided near an edge of the respective stub-like protrusions;

when the control signal given to said first control electrode represents a binary value of "0", the effective length L of the stub-like protrusion of said normally-on quantum interference device has the following relationship with the electron wavelength $\lambda$ $$L=(\lambda/4)(2m+1)$$

where m denotes 0 or an integer;

when the control signal given to said second control electrode represents a binary value of "0", the effective length L of the stub-like protrusion of said normally-off quantum interference device has the following relationship with the electron wavelength $\lambda$ $$L=(\lambda/4)(2n)$$

where n denotes an integer; and the value "1" of the control signal is set at such a value when the control signal given to said first and second control electrodes is changed from the binary value "0"

to "1", the effective stub length of the normally-on quantum interference device and the normally-off quantum interference device, respectively, varies by $\lambda/4$, whereby the normally-on quantum interference device and the normally-off quantum interference device perform operations complementary to each other.

10. a complementary logic circuit as claimed in claim 8, wherein said normally-on quantum interference device and said normally-off quantum interference device each comprise:

semiconductor heterojunctions laminated on a semiconductor substrate to form a two-dimensional electron gas channel;

a first electrode, a second electrode and a third electrode formed on said semiconductor heterojunctions and for forming a depletion region within the semiconductor heterojunctions by applying a negative voltage thereon thereby making the resulting two-dimensional electron gas channel a quantum wire of a stub structure comprising said entrance and said exit for electron waves and a stub formed between the entrance and the exit, said second electrode and said third electrode each having a respective first side substantially parallel to a side of said first electrode, and said second electrode and said third electrode each having a respective second side parallel to each other; and said first control electrode is provided on a site near an edge of said stub of the normally-on quantum interference device and said second control electrode is provided on a site near an edge of said stub of the normally-off quantum interference device.

11. A complementary logic circuit as claimed in claim 8, wherein said normally-on quantum interference device has a ring structure including a first branch and a second branch connected in parallel, each branch consisting of a quantum wire, said first control electrode comprising a Schottky electrode and being provided on said first branch, said first control electrode being given the control signal such that when the control signal represents a binary value of "0" or "1", the conductance takes a binary value of "1" or "0"; and said normally-off quantum interference device has a ring structure including a third branch and a fourth branch connected in parallel, each branch consisting of a quantum wire, said second control electrode comprising a Schottky electrode and being provided on said third branch, said second control electrode being given the control signal which takes a binary value of "0" or "1", and said fourth branch being provided with a gate electrode giving a fixed bias control signal which always takes a binary value of "1" so that the conductance takes a binary value of "0" or "1" in response to the "0" or "1" state of the control signal.

12. A quantum interference device as claimed in claim 1, wherein said first electrode means, said second electrode means, said third electrode means and said fourth electrode means are Schottky electrodes, respectively.

* * * * *